United States Patent
Kim et al.

(10) Patent No.: US 9,536,884 B2
(45) Date of Patent: Jan. 3, 2017

(54) SEMICONDUCTOR DEVICE HAVING POSITIVE FIXED CHARGE CONTAINING LAYER

(71) Applicant: Samsung Electronics Co., Ltd., Suwon-si (KR)

(72) Inventors: Jun-Soo Kim, Anyang-si (KR); Dong-Soo Woo, Seoul (KR); Se-myeong Jang, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 96 days.

(21) Appl. No.: 14/450,854

(22) Filed: Aug. 4, 2014

(65) Prior Publication Data

US 2015/0194438 A1     Jul. 9, 2015

(30) Foreign Application Priority Data

Jan. 6, 2014   (KR) .................. 10-2014-0001511

(51) Int. Cl.
  *H01L 27/115*    (2006.01)
  *H01L 27/108*    (2006.01)
(52) U.S. Cl.
  CPC ... *H01L 27/10891* (2013.01); *H01L 27/10876* (2013.01)
(58) Field of Classification Search
  CPC .................. H01L 27/10891; H01L 27/10876; H01L 27/115
  USPC ........................................................ 257/324
  See application file for complete search history.

(56) References Cited

U.S. PATENT DOCUMENTS

| | | | |
|---|---|---|---|
| 6,656,783 B2 | 12/2003 | Park | |
| 7,071,068 B2 | 7/2006 | Jeong | |
| 7,449,378 B2 | 11/2008 | Chidambarrao et al. | |
| 2005/0230734 A1 | 10/2005 | Ha et al. | |
| 2008/0283957 A1* | 11/2008 | Kang ................ | H01L 21/76897 257/499 |
| 2011/0037111 A1* | 2/2011 | Kim .................. | H01L 27/10885 257/302 |
| 2012/0231605 A1 | 9/2012 | Kim et al. | |
| 2012/0261672 A1 | 10/2012 | Chidambarrao et al. | |
| 2013/0095619 A1 | 4/2013 | Wehella-Gamage et al. | |
| 2014/0064004 A1* | 3/2014 | Jang ................. | H01L 29/66825 365/205 |

FOREIGN PATENT DOCUMENTS

| | | |
|---|---|---|
| KR | 10-2009-0044482 A | 5/2009 |
| KR | 10-0900237 | 5/2009 |
| KR | 10-2010-0026222 A | 3/2010 |
| KR | 10-1090373 | 11/2011 |
| KR | 10-2012-0120682 A | 11/2012 |
| KR | 10-2012-0121730 A | 11/2012 |

* cited by examiner

*Primary Examiner* — Asok K Sarkar
*Assistant Examiner* — Dmitriy Yemelyanov
(74) *Attorney, Agent, or Firm* — Myers Bigel, P.A.

(57) ABSTRACT

A semiconductor device can include a substrate including a plurality of active regions having a long axis in a first direction and a short axis in a second direction, the plurality of active regions being repeatedly and separately positioned along the first and second directions, an isolation film defining the plurality of active regions, a plurality of word lines extending across the plurality of active regions and the isolation film, and a positive fixed charge containing layer covering at least a portion of the plurality of word lines, respectively.

20 Claims, 22 Drawing Sheets

SEMICONDUCTOR DEVICE HAVING POSITIVE FIXED CHARGE CONTAINING LAYER

CROSS-REFERENCE TO RELATED APPLICATIONS

This U.S. non-provisional patent application claims priority under 35 U.S.C. §119 to Korean Patent Application No. 10-2014-0001511 filed on Jan. 6, 2014, in the Korean Intellectual Property Office (KIPO), the contents of which are herein incorporated by reference in their entirety.

FIELD

An aspect of the inventive concepts relates to a semiconductor device, and more particularly, to a semiconductor device having a positive fixed charge containing layer.

BACKGROUND

Semiconductor devices including isolation technology for isolating a large number of semiconductor devices may be used in highly integrated circuits.

SUMMARY

According to an aspect of the inventive concept, there is provided a semiconductor device including a substrate including a plurality of active regions having a long axis in a first direction and a short axis in a second direction, the plurality of active regions being repeatedly and separately positioned along the first and second directions, an isolation film defining the plurality of active regions, a plurality of word lines extending across the plurality of active regions and the isolation film, and a positive fixed charge containing layer covering at least a portion of the plurality of word lines, respectively.

In some embodiments, the upper surfaces of the word lines are lower than those of the upper surfaces of the plurality of active regions.

In some embodiments, the plurality of word lines may be bulb-type word lines that have lower cross-sections that are circular or have U-shaped lower cross-sections. On the other hand, the positive fixed charge containing layer may be formed of a different material from that of the isolation film. The isolation film may be formed of a single material.

In some embodiments, each of the plurality of word lines may include a first portion positioned between two active regions adjacent in the first direction and a second portion positioned between two active regions adjacent in the second direction, the first portion may be surrounded by the isolation film and the positive fixed charge containing layer, and the second portion may be surrounded by the isolation film.

In some embodiments, the positive fixed charge containing layer may cover side and lower surfaces of the plurality of word lines. In addition, an upper surface of the positive fixed charge containing layer may be positioned on an identical level as that of upper surfaces of the plurality of word lines.

In some embodiments, the positive fixed charge containing layer may be formed of silicon nitride or silicon oxynitride.

According to another aspect of the inventive concept, there is provided a semiconductor device including a semiconductor substrate having a trench, an isolation film in the trench, a plurality of active regions defined in the semiconductor substrate by the isolation film, a plurality of word lines that extend across the plurality of active regions and the isolation film, a positive fixed charge containing layer covering at least parts of the plurality of word lines, respectively, a first interlayer insulating film covering the plurality of active regions and the isolation film, a bit line on the first interlayer insulating film, a bit line contact connecting the bit line and a first active region selected from the plurality of active regions, a second interlayer insulating film covering the bit line on the first interlayer insulating film, a first storage electrode formed on the second interlayer insulating film, and a first storage contact connecting the first storage electrode and the first active region.

In some embodiments, a distance from the positive fixed charge containing layer to the first storage contact in the first direction may be smaller than a distance from the positive fixed charge containing layer to the bit line contact in the first direction.

In some embodiments, the semiconductor device may further include a second active region adjacent to the first active region among the plurality of active regions in a second direction, a second storage electrode connected to the second active region, and a second storage contact connecting the second storage electrode and the second active region. The isolation film positioned between the bit line contact on the first active region and the second storage contact may be an oxide film.

In some embodiments, the positive fixed charge containing layer may continuously extend along the plurality of word lines. On the other hand, among the plurality of active regions, a pair of active regions adjacent in the second direction may be shifted in opposite directions in the first direction to partially overlap in the second direction so that the pair of active regions are aligned athwart and the positive fixed charge containing layer may be absent from between the pair of active regions.

According to still another aspect of the inventive concept, there is provided a semiconductor device including a substrate including a plurality of active regions having a long axis in a first direction and a short axis in a second direction, the plurality of active regions being repeatedly and separately along the first and second directions, an isolation film defining the plurality of active regions, a plurality of word lines extending across the plurality of active regions and the isolation film, and a positive fixed charge containing layer covering at least a portion of the plurality of word lines, respectively, wherein at least a portion of the positive fixed charge containing layer is disposed in the isolation film.

In some embodiments, the positive fixed charge containing layer may not contact with the plurality of the active regions.

In some embodiments, the positive fixed charge containing layer may extend into the plurality of the active regions.

In some embodiments, the upper surfaces of the plurality of word lines may have lower levels than those of upper surfaces of the plurality of active regions.

In some embodiments, the positive fixed charge containing layer may cover side and lower surfaces of the plurality of word lines.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Figure 1A:
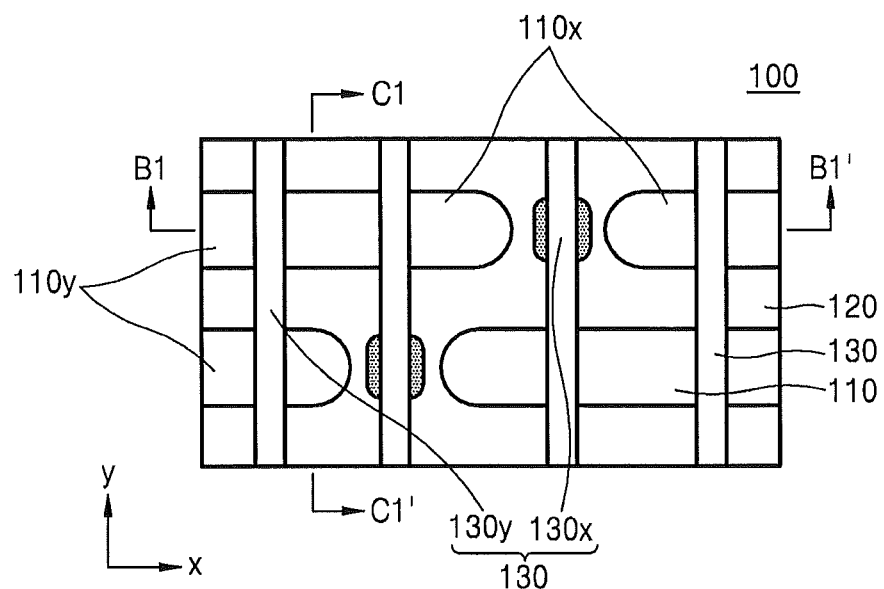
FIG. 1A is a plan view illustrating a partial structure of a semiconductor device according to an embodiment of the inventive concept.

The inventive concept is described hereinafter with reference to the accompanying drawings, in which elements of the inventive concept are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. The same elements in the drawings are denoted by the same reference numerals and a repeated explanation thereof will not be given.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept. For example, a first element may be named a second element and similarly a second element may be named a first element without departing from the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In other embodiments, a specific order of processes may be changed. For example, two processes consecutively described herein may be simultaneously performed or may be performed in an order opposite to that described.

Variations from the shapes of the illustrations as a result, for example, of manufacturing techniques and/or tolerances, are to be expected. Thus, exemplary embodiments should not be construed as limited to the particular shapes of regions illustrated herein but may be construed to include deviations in shapes that result, for example, from manufacturing.

Figure 1B:
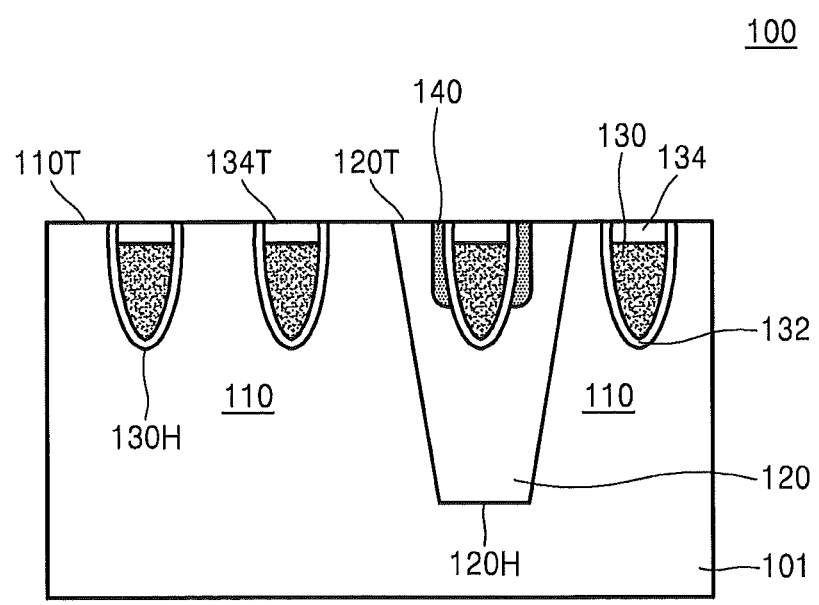
FIG. 1B is a cross-sectional view taken along line B1-B1' of FIG. 1A.
Figure 1C:
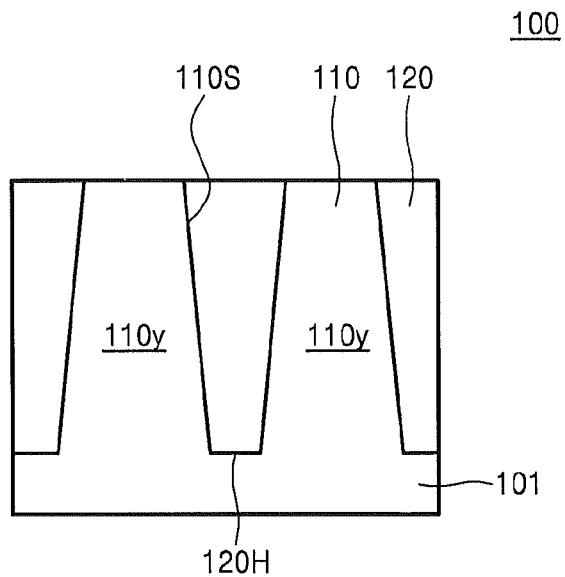
FIG. 1C is a cross-sectional view taken along line C1-C1' of FIG. 1A.

FIG. 1A is a plan view illustrating a partial structure of a semiconductor device 100 according to embodiments of the inventive concept. FIG. 1B is a cross-sectional view taken along line B1-B1' of FIG. 1A. FIG. 1C is a cross-sectional view taken along line C1-C1' of FIG. 1A.

Referring to FIGS. 1A to 1C, the semiconductor device 100 includes an isolation film 120 for defining a plurality of active regions 110 in a semiconductor substrate 101, a plurality of word lines 130, a gate dielectric film 132, a gate capping layer 134, and a positive fixed charge containing layer 140.

Each of the plurality of active regions 110 includes an upper surface 110T having a long axis in a first direction (the X direction of FIG. 1A) and a short axis in a second direction (the Y direction of FIG. 1A). The plurality of active regions 110 are repeatedly and separately formed in the first direction (the X direction of FIG. 1A) and the second direction (the Y direction of FIG. 1A).

The isolation film 120 includes a plurality of upper surfaces 120T separated from each other (when viewed in a plan view). The isolation film 120 is formed in a trench 120H formed in the semiconductor substrate 101. In some embodiments, the isolation film 120 may be formed of a single material, and the single material may be an oxide film. However, the inventive concept is not limited thereto, and the isolation film 120 may include other material(s) within the scope of the inventive concept.

The plurality of word lines 130 extend across the plurality of active regions 110 and the isolation film 120. In some embodiments, the plurality of word lines 130 are positioned on a lower level than that of the upper surfaces 110T of the plurality of active regions 110 or the upper surface 120T of the isolation film 120. That is, the plurality of word lines 130 may be formed in a plurality of trenches 130H that extend across the plurality of active regions 110 and the isolation film 120. When the plurality of word lines 130 are formed in the plurality of trenches 130H, an effective channel length of the semiconductor device 100 is increased so that a short channel effect may be reduced. In addition, the plurality of word lines 130 may be covered with the gate capping layer 134.

In some embodiments, the plurality of word lines 130 may have U-shaped lower cross-sections. The plurality of word lines 130 may be bulb-type word lines (refer to 230 of FIG. 2) that have lower cross-sections that are circular.

Each of the plurality of word lines 130 includes a first portion 130x positioned between two active regions 110x adjacent in the first direction among the plurality of active regions 110 and a second portion 130y positioned between two active regions 110y adjacent in the second direction among the plurality of active regions 110. In some embodiments, the first portion 130x may be surrounded by the isolation film 120 and the positive fixed charge containing layer 140. In addition, the second portion 130y may be surrounded by the isolation film 120.

In some embodiments, the gate dielectric film 132 may cover internal walls of the plurality of trenches 130H that extend across the plurality of active regions 110 and the isolation film 120. That is, the gate dielectric film 132 may be interposed between the plurality of word lines 130 and the plurality of active regions 110 or between the plurality of word lines 130 and the isolation film 120.

In some embodiments, the gate dielectric film 132 may be an oxide film and may be formed of the same material as that of the isolation film 120. In other embodiments, the gate dielectric film 132 may be formed of a different material from that of the isolation film 120. For example, the gate dielectric film 132 may be formed as a high K dielectric film.

In some embodiments, the gate capping layer 134 may be formed to cover the plurality of word lines 130. An upper surface 134T of the gate capping layer 134 may be positioned on the same level as those of the upper surfaces 110T of the plurality of active regions 110 and the upper surface 120T of the isolation film 120.

The positive fixed charge containing layer 140 covers at least parts of the plurality of word lines 130. Here, the positive fixed charge containing layer 140 may be positioned on a higher level than that of lower surfaces of the plurality of word lines 130.

In some embodiments, the positive fixed charge containing layer 140 may surround the first portion 130x positioned between the two active regions 110x adjacent in the first direction and does not surround the second portion 130y positioned between the two active regions 110y adjacent in the second direction.

In some embodiments, the positive fixed charge containing layer 140 is formed of a different material from that of the isolation film 120. The positive fixed charge containing layer 140 may be formed of silicon nitride or silicon oxynitride. However, the inventive concept is not limited thereto and the positive fixed charge containing layer 140 may include other material(s) within the scope of the inventive concept.

Figure 2:
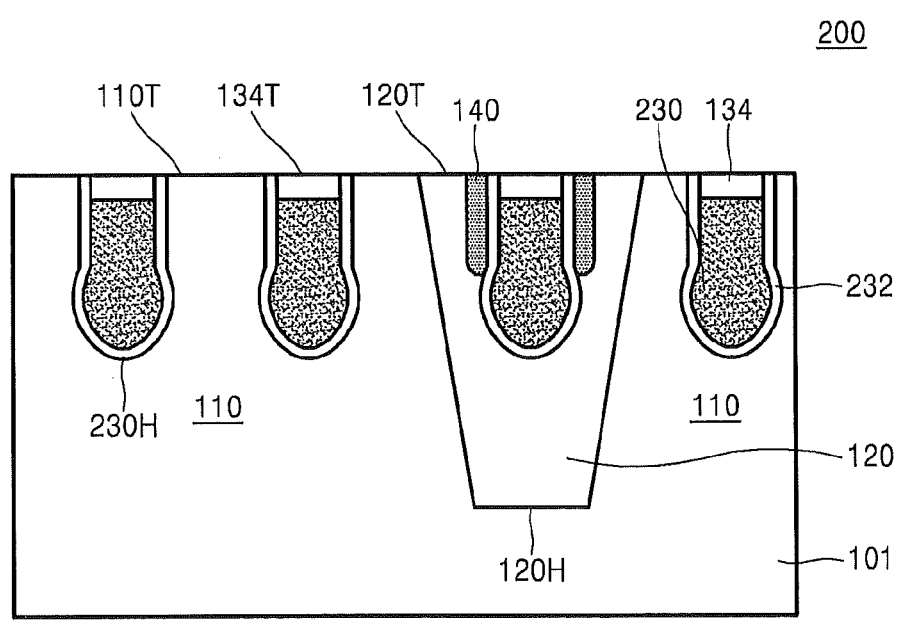
FIG. 2 is a cross-sectional view of a semiconductor device according to embodiments of the inventive concept, which is taken along line B1-B1' of FIG. 1 A.

The plurality of active regions 110y are repeatedly and separately formed in the second direction, FIG. 2 is a cross-sectional view of a semiconductor device 200 according to another embodiment of the inventive concept, which is taken along line B1-B1' of FIG. 1 A. In FIG. 2, the same reference numerals as those of FIGS. 1A to 1C refer to the same elements and detailed descriptions of the elements will not be repeated here.

Referring to FIG. 2, the semiconductor device 200 includes an isolation film 120 for defining a plurality of active regions 110 in a semiconductor substrate 101, a plurality of word lines 230, a gate dielectric film 232, a gate capping layer 134, and a positive fixed charge containing layer 140.

The plurality of word lines 230 extend across the plurality of active regions 110 and the isolation film 120. In some embodiments, the plurality of word lines 230 are positioned on a lower level than that of upper surfaces 110T of the plurality of active regions 110 or an upper surface 120T of the isolation film 120. That is, the plurality of word lines 230 may be formed in a plurality of trenches 230H that extend across the plurality of active regions 110 and the isolation film 120. In addition, the plurality of word lines 230 may be covered with the gate capping layer 134.

As illustrated in FIG. 2, the plurality of word lines 230 may be bulb-type word lines that have lower cross-sections that are circular.

When the plurality of word lines 230 are the bulb-type word lines, the plurality of word lines 230 are formed in the semiconductor substrate 101. Therefore, an effective channel length of the semiconductor device 200 can be increased so that a short channel effect may be reduced. In addition, since the plurality of word lines 230 have circular lower cross-sections, the doping density of the semiconductor substrate 101 may be reduced and drain-induced barrier lowering (DIBL) may be improved.

Each of the plurality of word lines 230 includes a first portion 130x positioned between two active regions 110x adjacent in a first direction and a second portion 130y positioned between two active regions 110y adjacent in a second direction (refer to FIG. 1A). In some embodiments, the first portion 130x may be surrounded by the isolation film 120 and the positive fixed charge containing layer 140. In addition, the second portion 130y may be surrounded by the isolation film 120.

In some embodiments, the gate dielectric film 232 may cover internal walls of the plurality of trenches 230H that extend across the plurality of active regions 110 and the isolation film 120. The gate dielectric film 232 may be interposed between the plurality of word lines 230 and the plurality of active regions 110 or between the plurality of word lines 230 and the isolation film 120.

In some embodiments, the gate dielectric film 232 may be an oxide film and may be formed of the same material as that of the isolation film 120. In other embodiments, the gate dielectric film 232 may be formed of a different material from that of the isolation film 120. For example, the gate dielectric film 232 may be formed as a high K dielectric film.

Figure 3A:
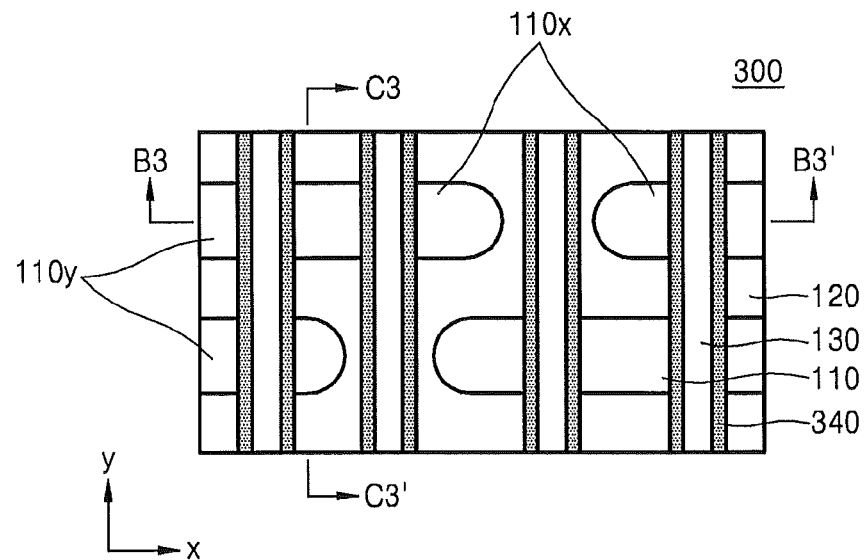
FIG. 3A is a plan view illustrating a partial structure of a semiconductor device according to embodiments of the inventive concept.
Figure 3B:
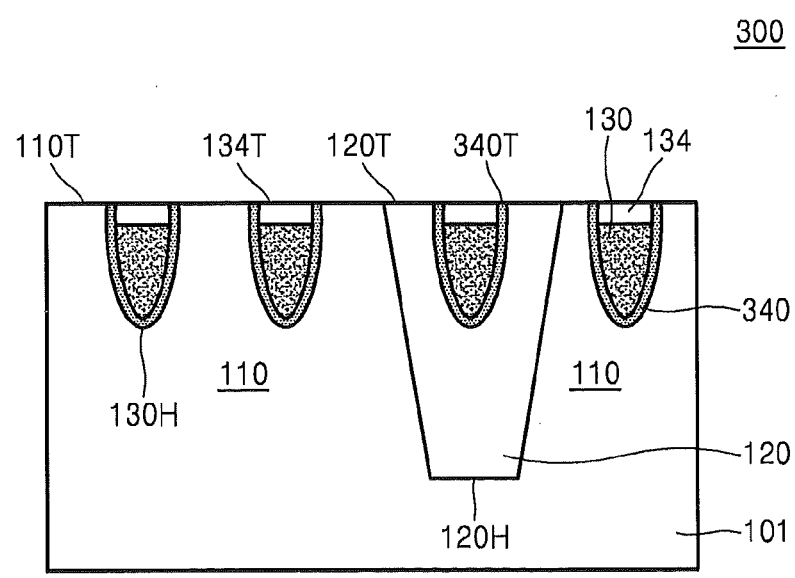
FIG. 3B is a cross-sectional view taken along line B3-B3' of FIG. 3A.
Figure 3C:
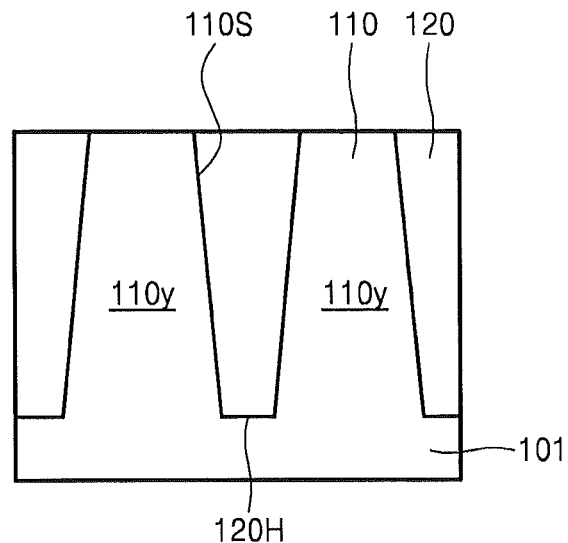
FIG. 3C is a cross-sectional view taken along line C3-C3' of FIG. 3A.

FIG. 3A is a plan view illustrating a partial structure of a semiconductor device 300 according to embodiments of the inventive concept. FIG. 3B is a cross-sectional view taken along line B3-B3' of FIG. 3A. FIG. 3C is a cross-sectional view taken along line C3-C3' of FIG. 3A. In FIGS. 3A to 3C, the same reference numerals as those of FIGS. 1A to 1C refer to the same elements and detailed descriptions of the elements will not be repeated here.

Referring to FIGS. 3A to 3C, the semiconductor device 300 includes an isolation film 120 for defining a plurality of active regions 110 in a semiconductor substrate 101, a plurality of word lines 130, a gate capping layer 134, and a positive fixed charge containing layer 340.

In operation of the semiconductor device 300, the positive fixed charge containing layer 340 may function as the gate dielectric film 132.

The plurality of word lines 130 are positioned on a lower level relative to an upper surface 340T of the positive fixed charge containing layer 340.

In some embodiments, the plurality of word lines 130 and the positive fixed charge containing layer 340 may have U-shaped lower cross-sections. In other embodiments, the plurality of word lines 130 and the positive fixed charge containing layer 340 may be bulb-type word lines that have lower cross-sections that are circular.

In some embodiments, the positive fixed charge containing layer 340 covers side and lower surfaces of the plurality of word lines 130. That is, the positive fixed charge containing layer 340 covers internal walls of a plurality of trenches 130H that extend across the plurality of active regions 110 and the isolation film 120. The positive fixed charge containing layer 340 may be interposed between the plurality of word lines 130 and the plurality of active regions 110 or between the plurality of word lines 130 and the isolation film 120. The upper surface 340T of the positive fixed charge containing layer 340 is positioned on the same level as those of upper surfaces 110T of the plurality of active regions 110 and an upper surface 120T of the isolation film 120.

In some embodiments, the positive fixed charge containing layer 340 may be formed of a different material from that of the isolation film 120. The positive fixed charge containing layer 340 may be formed of silicon nitride or silicon oxynitride. However, the inventive concept is not limited thereto and the positive fixed charge containing layer 340 may include other material(s) within the scope of the inventive concept.

A plurality of active regions 110y are repeatedly and separately formed in a second direction.

In the respective active regions that form the plurality of active regions 110y, side surfaces 110S of a plurality of active regions 110x formed in a first direction are surrounded by the isolation film 120. As described above, the isolation film 120 may be formed of a single material, and the single material may be an oxide film. However, the inventive concept is not limited thereto and the isolation film 120 may include other material(s) within the scope of the inventive concept.

Figure 4:
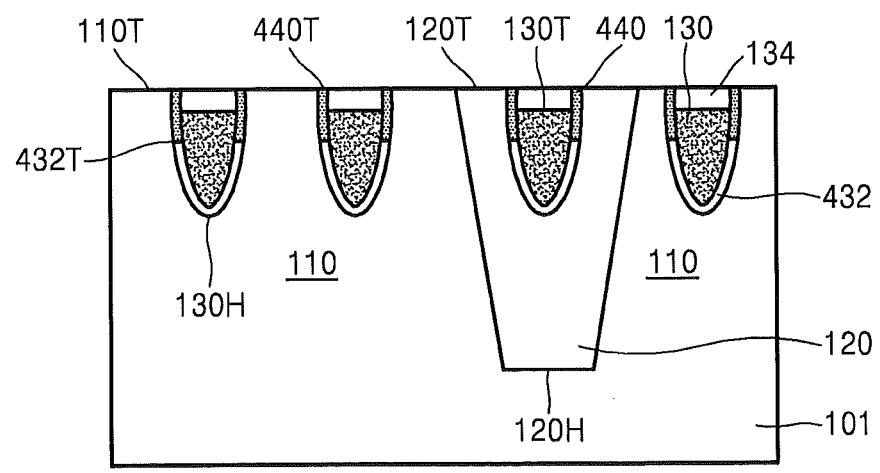
FIG. 4 is a cross-sectional view of a semiconductor device according to embodiments of the inventive concept, which is taken along line B3-B3' of FIG. 3A.

FIG. 4 is a cross-sectional view of a semiconductor device 400 according to another embodiment of the inventive concept, which is taken along line B3-B3' of FIG. 3A. In FIG. 4, the same reference numerals as those of FIGS. 1A to 3C refer to the same elements and detailed descriptions of the elements will not be repeated here.

Referring to FIG. 4, the semiconductor device 400 includes an isolation film 120 for defining a plurality of active regions 110 in a semiconductor substrate 101, a plurality of word lines 130, a gate dielectric film 432, a gate capping layer 134, and a positive fixed charge containing layer 440.

The gate dielectric film 432 may cover parts of internal walls of a plurality of trenches 130H that extend across the plurality of active regions 110 and the isolation film 120. That is, the gate dielectric film 432 may be interposed between the plurality of word lines 130 and the plurality of active regions 110 or between the plurality of word lines 130 and the isolation film 120. In some embodiments, an upper surface T432 of the gate dielectric film 432 may be positioned on a lower level than that of upper surfaces 130T of the plurality of word lines 130.

In some embodiments, the gate dielectric film 432 may be an oxide film and may be formed of the same material as that of the isolation film 120. In other embodiments, the gate dielectric film 432 may be formed of a different material from that of the isolation film 120. For example, the gate dielectric film 432 may be formed as a high K dielectric film.

The positive fixed charge containing layer 440 covers at least parts of the plurality of the word lines 130. In some embodiments, the positive fixed charge containing layer 440 covers side surfaces of the plurality of word lines 130 and the gate capping layer 134. Here, the positive fixed charge containing layer 440 may be positioned on a higher level than that of lower surfaces of the plurality of word lines 130. An upper surface 440T of the positive fixed charge containing layer 440 is positioned on the same level as those of upper surfaces 110T of the plurality of active regions 110 and an upper surface 120T of the isolation film 120.

Alternatively, the positive fixed charge containing layer 440 may be formed by processes described with respect to FIGS. 10A to 10E.

In some embodiments, the positive fixed charge containing layer 440 may be formed of a different material from that of the isolation film 120. The positive fixed charge containing layer 440 may be formed of silicon nitride or silicon oxynitride. However, the inventive concept is not limited thereto and the positive fixed charge containing layer 440 may include other material(s) within the scope of the inventive concept.

Figure 5:
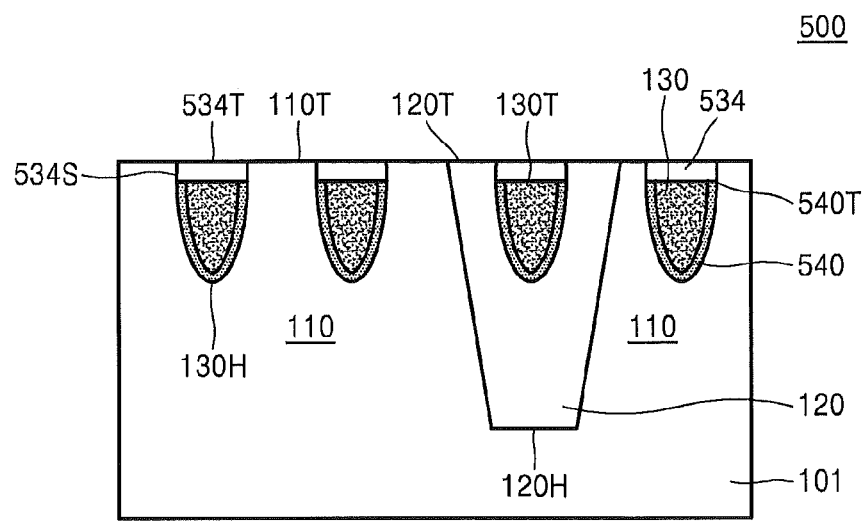
FIG. 5 is a cross-sectional view of a semiconductor device according to embodiments of the inventive concept, which is taken along line B3-B3' of FIG. 3A.

FIG. 5 is a cross-sectional view of a semiconductor device 500 according to another embodiment of the inventive concept, which is taken along line B3-B3' of FIG. 3A. In FIG. 5, the same reference numerals as those of FIGS. 1A to 4 refer to the same elements and detailed descriptions of the elements will not be repeated here.

Referring to FIG. 5, the semiconductor device 500 includes an isolation film 120 for defining a plurality of active regions 110 in a semiconductor substrate 101, a plurality of word lines 130, a gate capping layer 534, and a positive fixed charge containing layer 540.

In operation of the semiconductor device 500, the positive fixed charge containing layer 540 may function as the gate dielectric film 132.

In some embodiments, side surfaces 534S of the gate capping layer 534 may be surrounded by the plurality of active regions 110 or the isolation film 120. An upper surface 534T of the gate capping layer 534 is positioned on the same level as those of upper surfaces 110T of the plurality of active regions 110 and an upper surface 120T of the isolation film 120.

The positive fixed charge containing layer 540 covers side and lower surfaces of the plurality of word lines 130. In some embodiments, an upper surface 540T of the positive fixed charge containing layer 540 is positioned on the same level as that of upper surfaces 130T of the plurality of word lines 130.

In some embodiments, the positive fixed charge containing layer 540 may have a U-shaped lower cross-section. In other embodiments, the positive fixed charge containing layer 540 may have a circular lower cross-section.

In some embodiments, the positive fixed charge containing layer 540 may be formed of a different material from that of the isolation film 120. The positive fixed charge containing layer 540 may be formed of silicon nitride or silicon oxynitride. However, the inventive concept is not limited thereto and the positive fixed charge containing layer 540 may include other material(s) within the scope of the inventive concept.

Figure 6A:
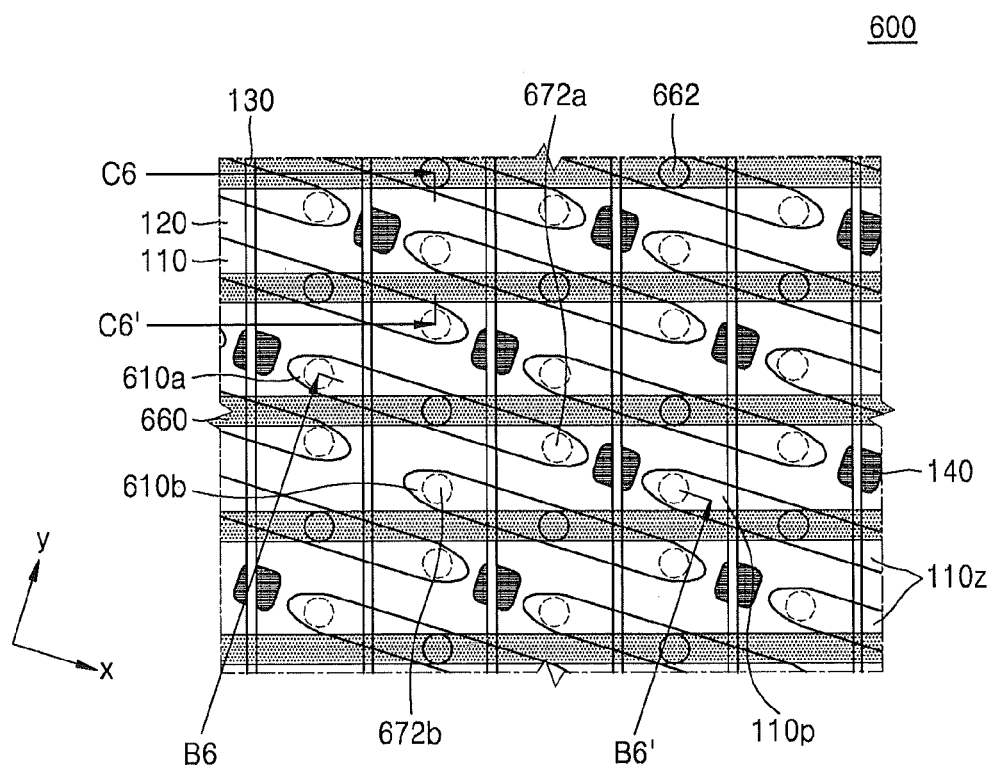
FIG. 6A is a plan view illustrating a partial structure of a semiconductor device according to embodiments of the inventive concept.
Figure 6B:
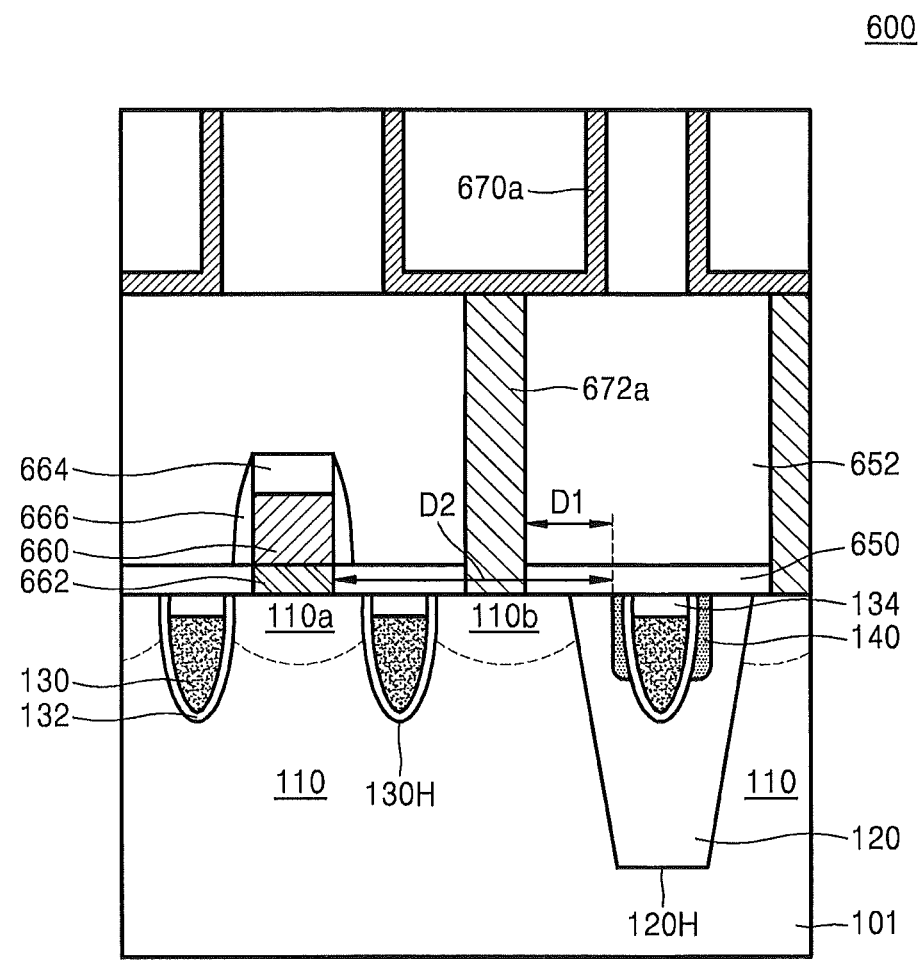
FIG. 6B is a cross-sectional view taken along line B6-B6' of FIG. 6A.
Figure 6C:
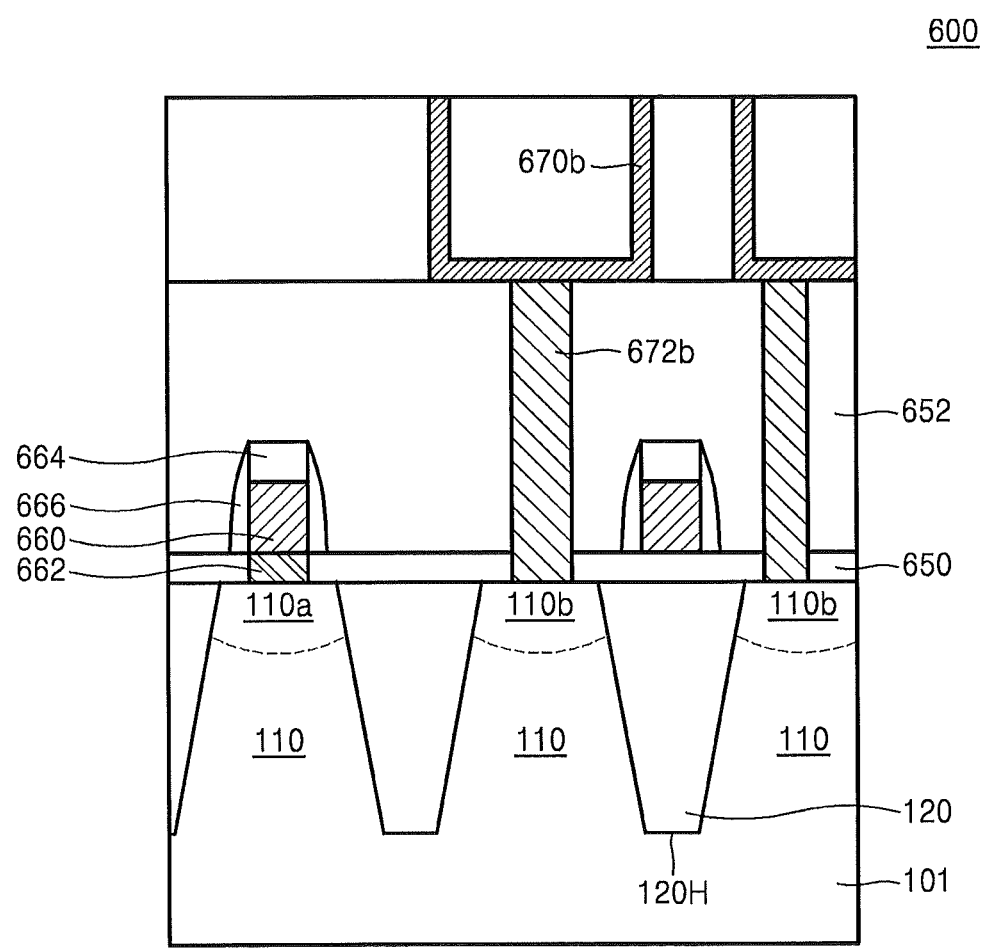
FIG. 6C is a cross-sectional view taken along line C6-C6' of FIG. 6A.

FIG. 6A is a plan view illustrating a partial structure of a semiconductor device 600 according to embodiments of the inventive concept. FIG. 6B is a cross-sectional view taken along line B6-B6' of FIG. 6A. FIG. 6C is a cross-sectional view taken along line C6-C6' of FIG. 6A. In FIGS. 6A to 6C, the same reference numerals as those of FIGS. 1A to 5 refer to the same elements and detailed descriptions of the elements will not be repeated here.

Referring to FIGS. 6A to 6C, the semiconductor device 600 includes an isolation film 120 for defining a plurality of active regions 110 in a semiconductor substrate 101, a plurality of word lines 130, a positive fixed charge containing layer 140, a first interlayer insulating film 650, a second interlayer insulating film 652, a bit line 660, a bit line contact 662, a first storage electrode 670a, a second storage electrode 670b, a first storage contact 672a, and a second storage contact 672b.

The semiconductor device 600 may be, for example, a part of a cell array region of a semiconductor memory device.

Each of the plurality of active regions 110 includes an upper surface having a long axis in a first direction (the X direction of FIG. 6A) and a short axis in a second direction (the Y direction of FIG. 6A). The plurality of active regions 110 are repeatedly and separately formed in the first direction (the X direction of FIG. 6A) and the second direction (the Y direction of FIG. 6A).

The semiconductor substrate 101 is planar having lower and upper surfaces and includes a plurality of trenches 130H that extend across the plurality of active regions 110 and the isolation film 120. In some embodiments, the semiconductor substrate 101 may be, for example, a silicon substrate. The isolation film 120 is formed in a trench 120H formed in the semiconductor substrate 101.

The plurality of active regions 110 are defined in the semiconductor substrate 101 by the isolation film 120. Here, the plurality of active regions 110 may be angled with respect to the plurality of word lines 130 and the bit line 660 at a predetermined angle. That is, in order to minimize a cell area of the semiconductor device 600, the plurality of word lines 130 and the bit line 660 may perpendicularly intersect, respectively. Here, the plurality of active regions 11Q may be limited to being bar-shaped by the isolation film 120 and may be diagonal with respect to the plurality of word lines 130 and the bit line 660.

Among the plurality of active regions 110, a pair of active regions 110z adjacent in the second direction, are shifted in opposite directions in the first direction to partially overlap in the second direction so that the pair of active regions 110z may be aligned athwart.

In some embodiments, among the plurality of active regions 110, between the pair of active regions 110z adjacent in the second direction, the positive fixed charge containing layer 140 is not formed.

Each of the plurality of active regions 110 may include a first source/drain region 110a and a second source/drain region 110b. The first source/drain region 110a and the second source/drain region 110b may be formed by, for example, an ion implantation process.

In a first active region 610a selected from the plurality of active regions 110, two adjacent word lines among the plurality of word lines 130 and the bit line 660 may intersect.

A second active region 610b is defined as an active region adjacent to the first active region 610a in the second direction among the plurality of active regions 110. In some embodiments, the isolation film 120 positioned between the bit line contact 662 on the first active region 610a and the second storage contact 672b may be formed of an oxide film.

In some embodiments, a distance D1 from the positive fixed charge containing layer 140 to the first storage contact 672a in the first direction is smaller than a distance D2 from the positive fixed charge containing layer 140 to the bit line contact 662 in the first direction.

The first interlayer insulating film 650 covers the plurality of active regions 110 and the isolation film 120 on the semiconductor substrate 101. That is, the first interlayer insulating film 650 covers an upper surface on which processes to be described with respect to FIGS. 8A to 11C are performed. In some embodiments, the first interlayer insulating film 650 is formed by a deposition process and, after the first interlayer insulating film 650 is formed, a chemical mechanical polishing (CMP) process may be performed. The first interlayer insulating film 650 may be, for example, oxide or nitride film based.

The bit line 660 diagonally extends with respect to the first direction. In addition, the bit line 660 may extend orthogonal to the plurality of word lines 130. In some embodiments, the bit line 660 may be formed of doped silicon having conductivity. However, the inventive concept is not limited thereto and the bit line 660 may be formed of metal or a metal compound. For example, the bit line 660 may be formed of metal such as tungsten (W), aluminium (Al), copper (Cu), molybdenum (Mo), titanium (Ti), tantalum (Ta), and ruthenium (Ru), metal nitride such as titanium nitride (TiN), tungsten nitride (WN), and tantalum nitride (TaN), or metal silicide such as cobalt silicide ($CoSi_2$), titanium silicide ($TiSiO_2$), and tungsten silicide ($WSi_2$).

The bit line 660 may have two or more kinds of widths in accordance with a position thereof. A width of the bit line 660 may increase with respect to the bit line contact 662. Therefore, the bit line 660 may have a tab structure in which a portion thereof that overlaps the first source/drain region 110a may have a larger width than that of a portion thereof that does not overlap the first source/drain region 110a.

The bit line contact 662 connects the bit line 660 and the first source/drain region 110a. The bit line contact 662 may be formed of doped silicon, like the bit line 660. The bit line 660 may further include carbon.

A bit line contact hole for forming the bit line contact 662 may be formed in the first interlayer insulating film 650 by etching the first interlayer insulating film 650 formed on the first source/drain region 110a. Continuously, the bit line contact 662 may be formed by depositing doped silicon in the formed bit line contact hole and performing a CMP process.

A bit line capping layer 664 may function as a protective film for protecting the bit line 660. In some embodiments, the bit line capping layer 664 may be silicon nitride having an insulating property.

Insulating spacers 666 are formed on side walls of the bit line 660. An insulating film is formed on the first interlayer insulating film 650 where the bit line 660 and the bit line capping layer 664 are formed and an etching process is performed on the insulating film to form the insulating spacers 666. The etching process may be a dry etching process, and the insulating spacers 666 may include oxide or nitride such as silicon nitride.

The second interlayer insulating film 652 is formed on the first interlayer insulating film 650 to cover the bit line 660. The second interlayer insulating film 652 may be a tetraethoxysilane (TEOS) oxide film or a high density plasma (HDP) oxide film having high step coverage. In FIG. 6B, the second interlayer insulating film 652 is formed of a single material layer. In some embodiments, the second interlayer insulating film 652 may be formed of a plurality of layers.

The first storage contact 672a and the second storage contact 672b connect the second source/drain region 110b formed in each of the plurality of active regions 110 to the first storage electrode 670a and the second storage electrode 670b, respectively. The first storage contact 672a and the second storage contact 672b may be formed of, for example, polysilicon (Poly-Si).

In some embodiments, the first storage contact 672a and the second storage contact 672b may be formed by etching the second interlayer insulating film 652 in a position where the first storage electrode 670a and the second storage electrode 670b are to be formed. Specifically, a mask pattern for defining a position in which the first storage electrode 670a and the second storage electrode 670b are to be formed is formed on the second interlayer insulating film 652 by a photolithography technology and the first interlayer insulating film 650 and the second interlayer insulating film 652 are removed by using the mask pattern as an etching mask to form a storage contact hole. An etching process for forming the storage contact hole may be performed while continuously or discontinuously changing an etching condition such as wet etching or dry etching. Continuously, after the remaining mask pattern is removed by common strip and ashing processes and the storage contact hole is washed, the first storage contact 672a and the second storage contact 672b are formed.

The first storage electrode 670a and the second storage electrode 670b are connected to the second source/drain region 110b formed in each of the plurality of active regions 110 through the first storage contact 672a and the second storage contact 672b, respectively. The first storage electrode 670a and the second storage electrode 670b may be formed of a material such as Ti, TiN, TaN, platinum (Pt), W, Poly-Si, and silicon germanium (SiGe).

In some embodiments, the first storage electrode 670a and the second storage electrode 670b may be cylinder-shaped. The first storage electrode 670a and the second storage electrode 670b may be also pillar-shaped without being limited thereto.

Figure 7A:
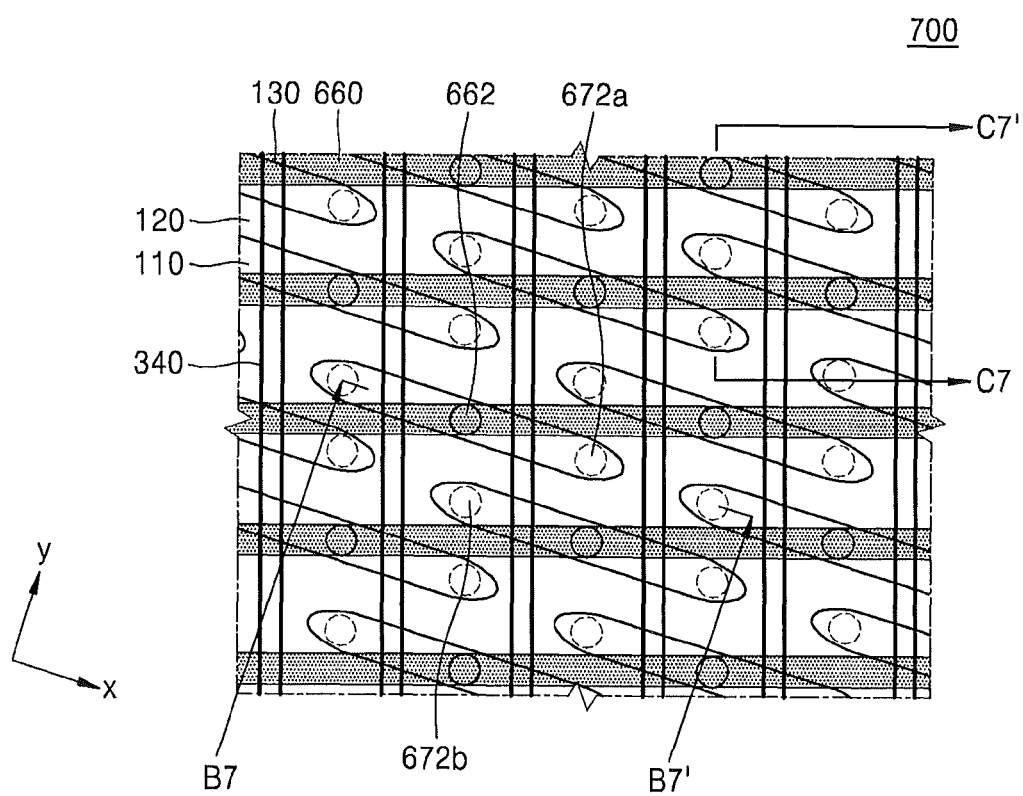
FIG. 7A is a plan view illustrating a partial structure of a semiconductor device according to embodiments of the inventive concept.
Figure 7B:
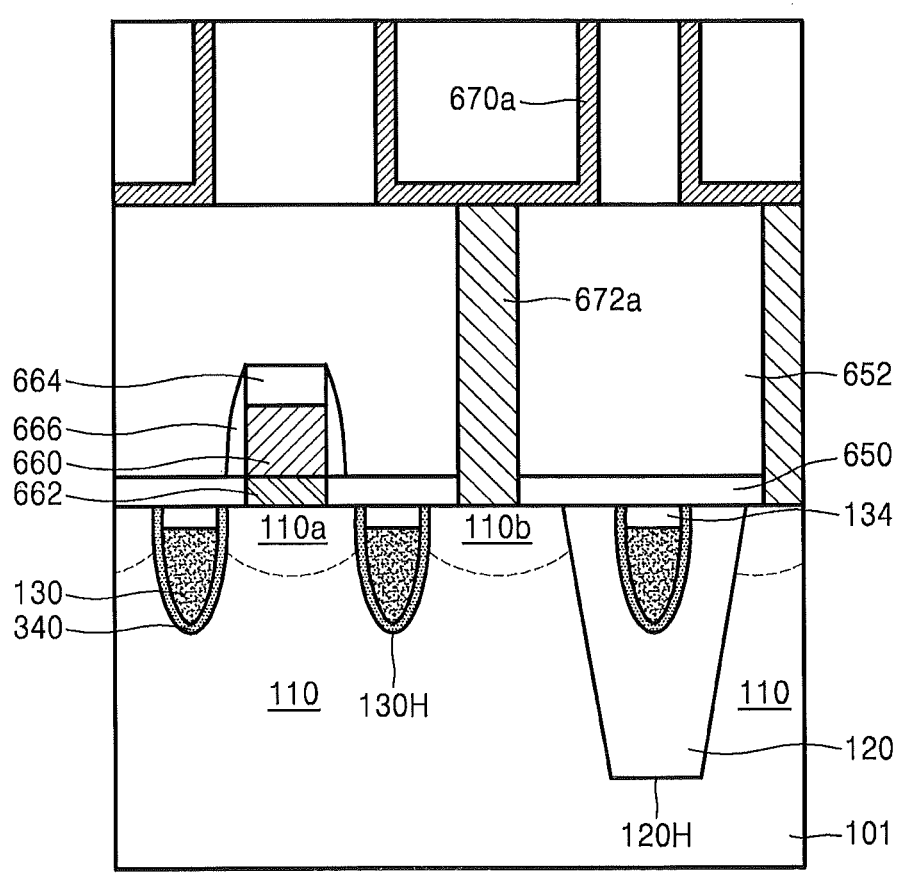
FIG. 7B is a cross-sectional view taken along line B7-B7' of FIG. 7A.
Figure 7C:
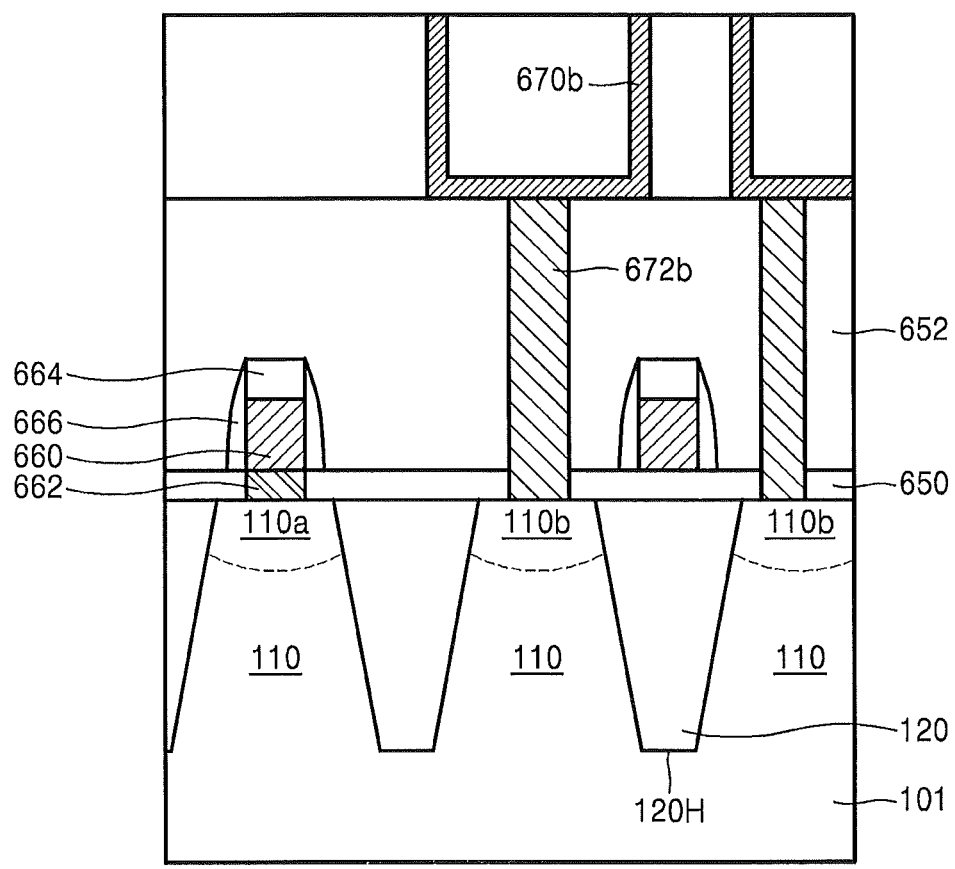
FIG. 7C is a cross-sectional view taken along line C7-C7' of FIG. 7A.

FIG. 7A is a plan view illustrating a partial structure of a semiconductor device 700 according to embodiments of the inventive concept. FIG. 7B is a cross-sectional view taken along line B7-B7' of FIG. 7A. FIG. 7C is a cross-sectional view taken along line C7-C7' of FIG. 7A. In FIGS. 7A to 7C, the same reference numerals as those of FIGS. 1A to 6C refer to the same elements and detailed descriptions of the elements will not be repeated here.

Referring to FIGS. 7A to 7C, the semiconductor device 700 includes an isolation film 120 for defining a plurality of active regions 110 in a semiconductor substrate 101, a plurality of word lines 130, a positive fixed charge containing layer 340, a first interlayer insulating film 650, a second interlayer insulating film 652, a bit line 660, a bit line contact 662, a first storage electrode 670a, a second storage electrode 670b, a first storage contact 672a, and a second storage contact 672b.

The semiconductor device 700 may be, for example, a part of a cell array region of a semiconductor memory device.

Each of the plurality of active regions 110 includes an upper surface having a long axis in a first direction (the X direction of FIG. 7A) and a short axis in a second direction (the Y direction of FIG. 7A). The plurality of active regions 110 are repeatedly and separately formed in the first direction (the X direction of FIG. 7A) and the second direction (the Y direction of FIG. 7A).

In operation of the semiconductor device 700, the positive fixed charge containing layer 340 may function as the gate dielectric film 132.

The positive fixed charge containing layer 340 covers side and lower surfaces of the plurality of word lines 130. In some embodiments, the positive fixed charge containing layer 340 continuously extends along the plurality of word lines 130.

FIGS. 8A to 8E are cross-sectional views illustrating methods of manufacturing semiconductor devices, according to embodiments of the inventive concept in the order. FIGS. 8A to 8E illustrate cross-sectional structures of portions corresponding to the cross-section taken along line B1-B1' of FIG. 1A. In FIGS. 8A to 8E, the same reference numerals as those of FIGS. 1A to 1C refer to the same elements and detailed descriptions of the elements will not be repeated here.

Figure 8A:
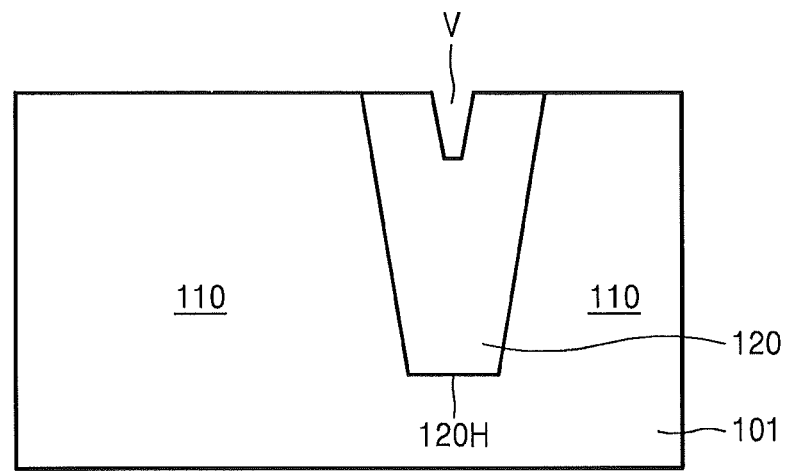
FIGS. 8A to 8E are cross-sectional views illustrating methods of manufacturing a semiconductor device, according to embodiments of the inventive concept in the order.

Referring to FIG. 8A, the isolation film 120 is formed in the trench 120H of the semiconductor substrate 101. A void V may be formed in the upper surface of the isolation film 120. The isolation film 120 may be formed of, for example, silicon oxide.

In some embodiments, a process of forming the isolation film 120 may be performed by chemical vapor deposition (CVD) or physical vapor deposition (PVD). Specifically, in CVD, the isolation film 120 may be formed by thermal CVD of generating vapor of a compound by thermal energy, plasma CVD of decomposing a reaction gas by plasma, and photo-induced CVD of decomposing raw material gas molecules by optical energy from a light source, such as laser light. In the PVD of accumulating generated vapor to grow the isolation film 120, the isolation film 120 may be formed by vacuum deposition, sputtering, and ion plating.

Figure 8B:
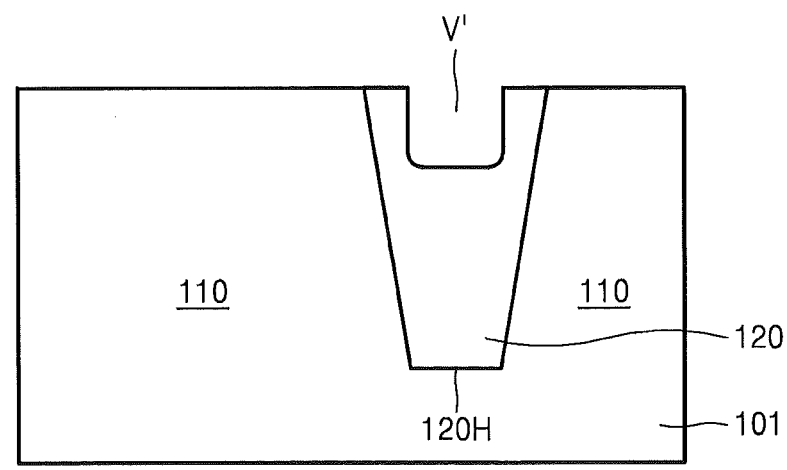

Referring to FIG. 8B, the void V formed in the upper surface of the isolation film 120 is enlarged to a predetermined size to form an enlarged void V'. In some embodiments, the void V is enlarged by an etching process. Here, the etching process may be a wet etching process or a dry etching process.

Figure 8C:
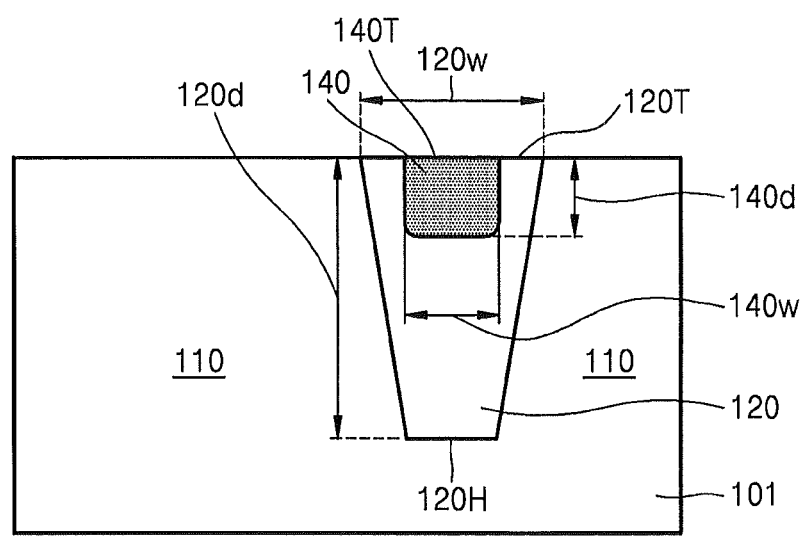

Referring to FIG. 8C, the enlarged void V' is filled with the positive fixed charge containing layer 140. That is, a width and a length of the enlarged void V' are equal to a width 140w and a depth 140d of the positive fixed charge containing layer 140. In some embodiments, an upper surface 140T of the positive fixed charge containing layer 140 is positioned on the same level as that of the upper surface 120T of the isolation film 120. In some embodiments, the width 140w of the positive fixed charge containing layer 140 is smaller than the width 120w of the isolation film 120. The depth 140d of the positive fixed charge containing layer 140 is smaller than a depth 120d of the isolation film 120.

Figure 8D:
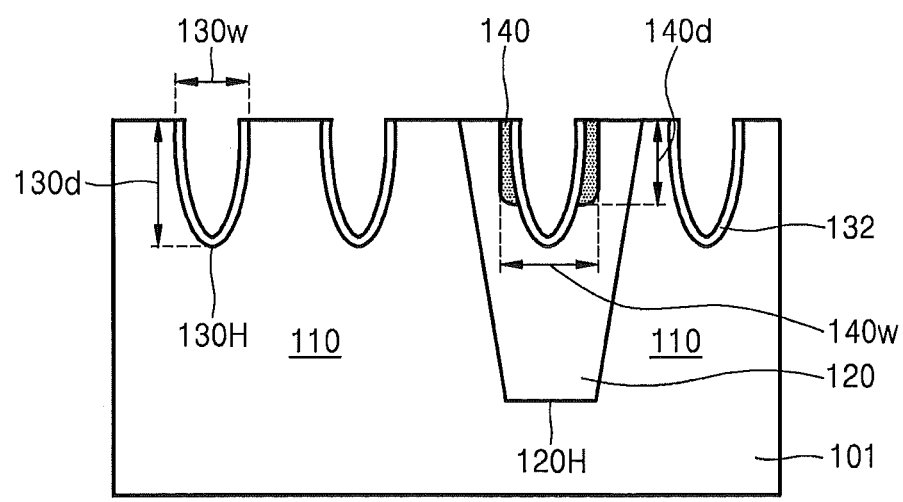

Referring to FIG. 8D, the plurality of trenches 130H that extend across the plurality of active regions 110 and the isolation film 120 are formed.

In some embodiments, a width 130w of each of the plurality of trenches 130H is smaller than the width 140w of the positive fixed charge containing layer 140. A depth 130d of each of the plurality of trenches 130H is larger than the depth 140d of the positive fixed charge containing layer 140.

The gate dielectric film 132 is formed in the plurality of trenches 130H. A process of forming the gate dielectric film 132 may be performed by CVD such as thermal CVD of generating vapor of a compound by thermal energy, plasma CVD of decomposing a reaction gas by plasma, and photo-induced CVD of decomposing raw material gas molecules by optical energy from a light source, such as laser light, or PVD such as vacuum deposition, sputtering, and ion plating.

In some embodiments, a thickness of the gate dielectric film 132 may be no less than 2 nm. In some embodiments, the gate dielectric film 132 may be a silicon oxide ($SiO_2$) film. The gate dielectric film 132 may be formed of various materials such as a hafnium oxide ($HfO_2$) film and a lanthanum oxide ($La_2O_3$) film.

Figure 8E:
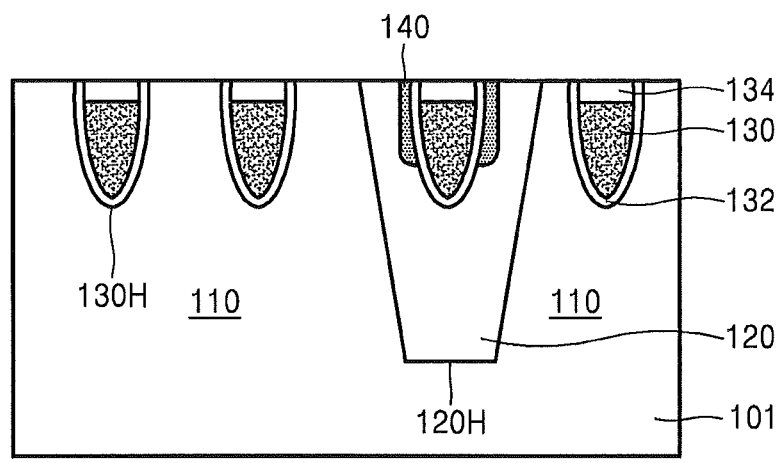

Referring to FIG. 8E, the plurality of word lines 130 are formed on the gate dielectric film 132. As described above, the plurality of word lines 130 are positioned on a lower level relative to the upper surfaces 110T of the plurality of active regions 110 or the upper surface 120T of the isolation film 120 (refer to FIG. 1B). The gate capping layer 134 covers the plurality of word lines 130.

Figure 9A:
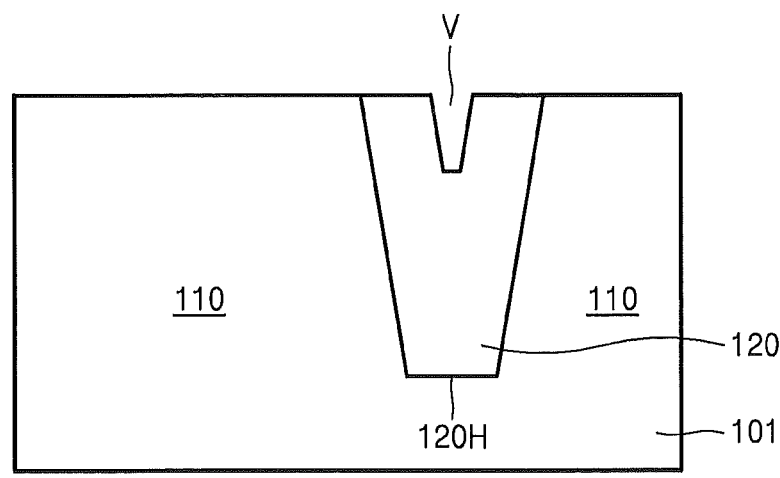
FIGS. 9A to 9C are cross-sectional views illustrating methods of manufacturing semiconductor devices, according to embodiments of the inventive concept in the order.
Figure 9B:
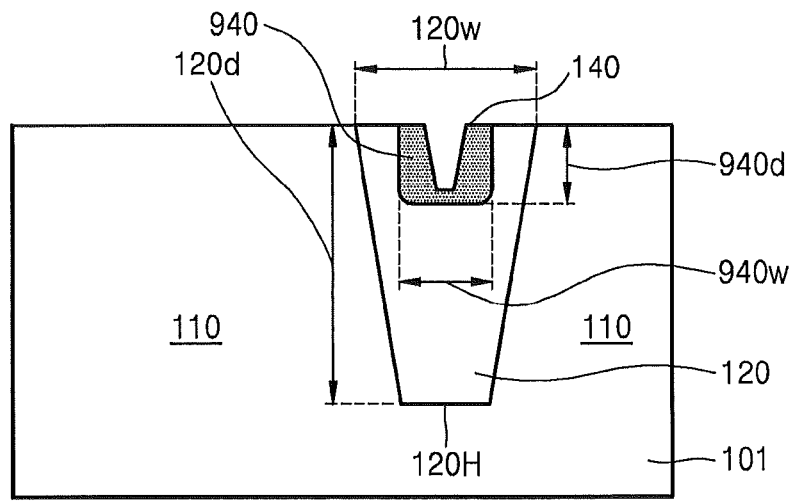
Figure 9C:
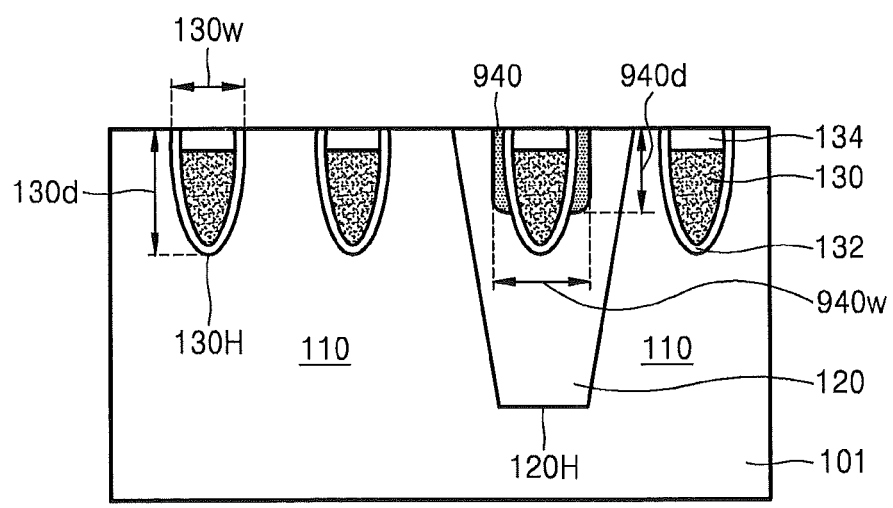

FIGS. 9A to 9C are cross-sectional views illustrating methods of manufacturing a semiconductor device, according to embodiments of the inventive concept. FIGS. 9A to 9C illustrate cross-sectional structures of portions corresponding to the cross-section taken along line B1-B1' of FIG. 1A. In FIGS. 9A to 9C, the same reference numerals as those of FIGS. 1A to 1C refer to the same elements and detailed descriptions of the elements will not be repeated here.

Referring to FIG. 9A, the isolation film 120 is formed in the trench 120H of the semiconductor substrate 101. A void V may be formed in the upper surface of the isolation film 120. The isolation film 120 may be formed by a deposition process. The deposition process may be similar to the process described with reference to FIG. 8A.

Referring to FIG. 9B, a positive fixed charge containing layer 940 is formed by a nitrogen ion implantation process. In some embodiments, the positive fixed charge containing layer 940 may be formed by a plasma nitrification process. Here, the plasma nitrification process refers to a process of implanting nitrogen atoms into silicon by using plasma. In some embodiments, the positive fixed charge containing layer 940 may be formed by performing the plasma nitrification process on the void V formed in the isolation film 120 with a predetermined slope.

In some embodiments, a width 940w of the positive fixed charge containing layer 940 is smaller than the width 120w of the isolation film 120. A depth 940d of the positive fixed charge containing layer 940 is smaller than the depth 120d of the isolation film 120.

Referring to FIG. 9C, the plurality of trenches 130H that extend across the plurality of active regions 110 and the isolation film 120 are formed, and the gate dielectric film 132 is formed in the plurality of trenches 130H. Then, the plurality of word lines 130 are formed on the gate dielectric film 132. As described above, the plurality of word lines 130 are positioned on a lower level relative to the upper surfaces 110T of the plurality of active regions 110 or the upper surface 120T of the isolation film 120 (refer to FIG. 1B). The gate capping layer 134 covers the, plurality of word lines 130. Such a series of processes may be similar to the processes described with reference to FIGS. 8D and 8E.

In some embodiments, a width 130w of each of the plurality of trenches 130H is smaller than the width 940w of the positive fixed charge containing layer 940. A depth 130d of each of the plurality of trenches 130H is larger than the depth 940d of the positive fixed charge containing layer 940.

Figure 10A:
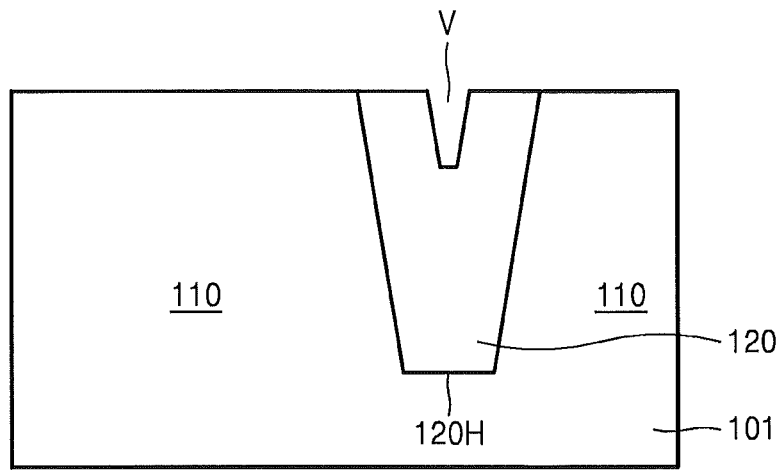
FIGS. 10A to 10C are cross-sectional views illustrating methods of manufacturing semiconductor devices, according to embodiments of the inventive concept in the order.
Figure 10B:
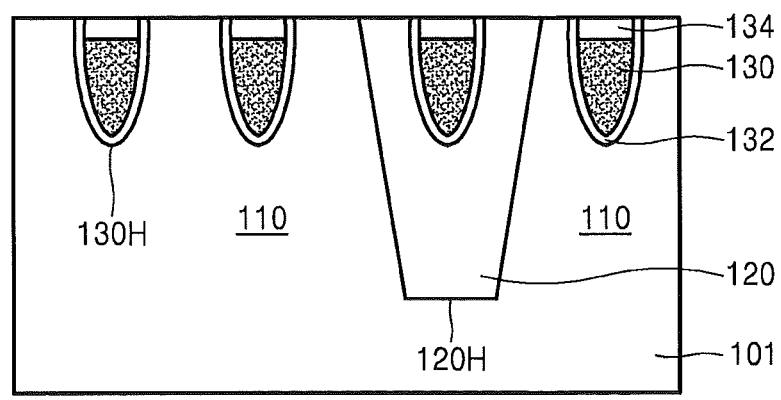
Figure 10C:
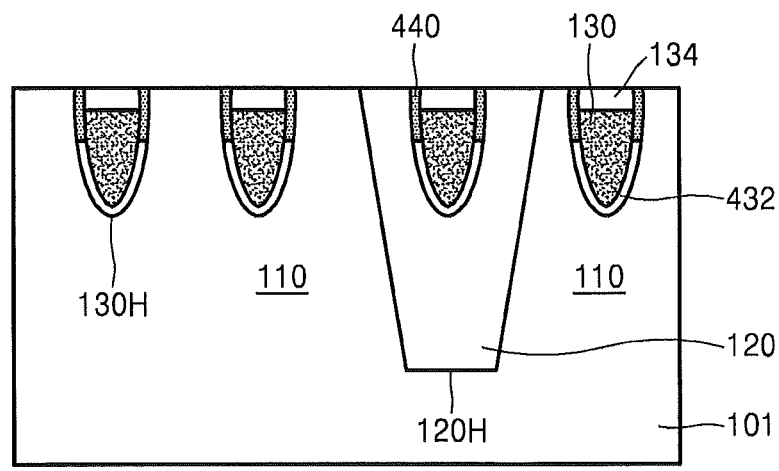

FIGS. 10A to 10C are cross-sectional views illustrating methods of manufacturing a semiconductor device, according to embodiments of the inventive concept. FIGS. 10A to 10C illustrate cross-sectional structures of portions corresponding to the cross-section taken along line B3-B3' of FIG. 3A. In FIGS. 10A to 10C, the same reference numerals as those of FIGS. 1A to 9C refer to the same elements and detailed descriptions of the elements will not be repeated here.

Referring to FIG. 10A, the isolation film 120 is formed in the trench 120H of the semiconductor substrate 101. The isolation film 120 may be formed by a similar process to the process described with reference to FIG. 8A.

Referring to FIG. 10B, the plurality of trenches 130H that extend across the plurality of active regions 110 and the isolation film 120 are formed, and the gate dielectric film 132 is formed in the plurality of trenches 130H. Then, the plurality of word lines 130 are formed on the gate dielectric film 132. The gate capping layer 134 covers the plurality of word lines 130. Such a series of processes may be similar to the processes described with reference to FIGS. 8D and 8E.

Referring to FIG. 10C, a plasma nitrification process of implanting nitrogen atoms into silicon by using plasma is performed on an upper surface of the gate dielectric film 132 with a predetermined slope to form the positive fixed charge containing layer 440. As a result, a part of the gate dielectric film 132 remains as the gate dielectric film 432.

The positive fixed charge containing layer 440 covers at least parts of the plurality of word lines 130. In some embodiments, the positive fixed charge containing layer 440 covers the side surfaces of the plurality of word lines 130 and the gate capping layer 134. As described with reference to FIG. 4, the positive fixed charge containing layer 440 may be positioned on a higher level relative to the lower surfaces of the plurality of word lines 130. The upper surface 440T of the positive fixed charge containing layer 440 is positioned on the same level as those of the upper surfaces 110T of the plurality of active regions 110 and the upper surface 120T of the isolation film 120 (refer to FIG. 4).

The gate dielectric film 432 covers parts of the internal walls of the plurality of trenches 130H that extend across the plurality of active regions 110 and the isolation film 120. The gate dielectric film 432 may be interposed between the plurality of word lines 130 and the plurality of active regions 110 or between the plurality of word lines 130 and the isolation film 120. In some embodiments, the upper surface T432 of the gate dielectric film 432 may be positioned on a lower level relative to the upper surfaces 130T of the plurality of word lines 130 (refer to FIG. 4).

Figure 11A:
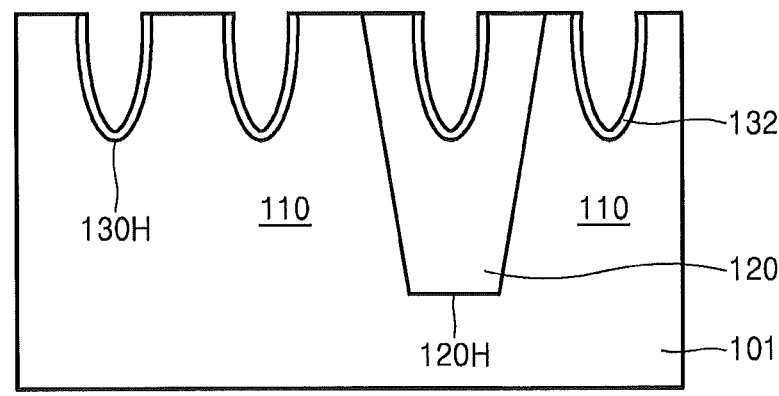
FIGS. 11A to 11C are cross-sectional views illustrating methods of manufacturing semiconductor devices, according to embodiments of the inventive concept in the order.
Figure 11B:
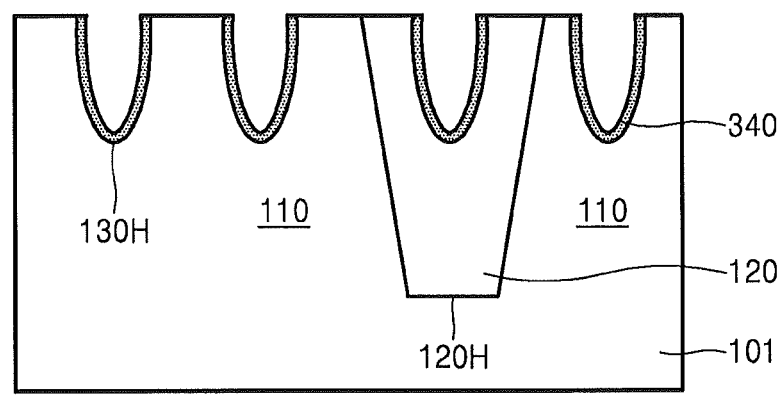
Figure 11C:
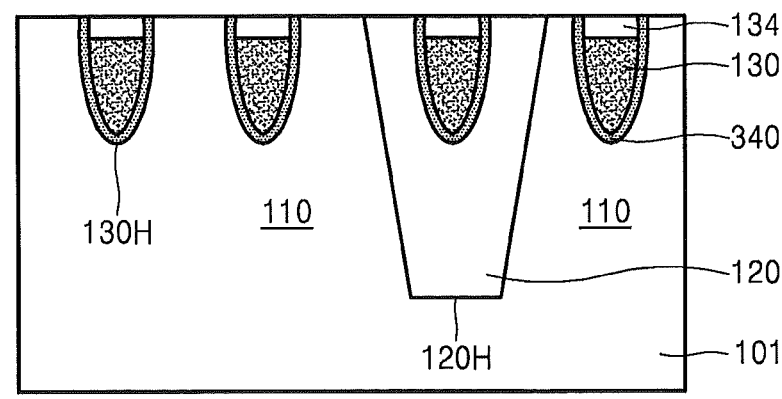

FIGS. 11A to 11C are cross-sectional views illustrating methods of manufacturing a semiconductor device according to embodiments of the inventive concept. FIGS. 11A to 11C illustrate cross-sectional structures of portions corresponding to the cross-section taken along line B3-B3' of FIG. 3A. In FIGS. 11A to 11C, the same reference numerals as those of FIGS. 1A to 10C refer to the same elements and detailed descriptions of the elements will not be repeated here.

Referring to FIG. 11A, the isolation film 120 is formed in the trench 120H of the semiconductor substrate 101. The isolation film 120 may be formed by a similar process to the process described with reference to FIG. 8A. Then, the plurality of trenches 130H that extend across the plurality of active regions 110 and the isolation film 120 are formed, and the gate dielectric film 132 is formed in the plurality of trenches 130H. Such a series of processes may be similar to the processes described with reference to FIG. 8D.

Referring to FIG. 11B, a plasma nitrification process of implanting nitrogen atoms into silicon by using plasma is performed on the gate dielectric film 132 with a predetermined slope to form the positive fixed charge containing layer 340.

As described above, the gate dielectric film 132 may be formed of silicon oxide. Therefore, the positive fixed charge containing layer 340 formed by performing the plasma nitrification process on the gate dielectric film 132 may be formed of silicon oxynitride. That is, in operation of the semiconductor device, the positive fixed charge containing layer 340 may function as the gate dielectric film 132. In some embodiments, the positive fixed charge containing layer 340 covers parts of the internal walls of the plurality of trenches 130H that extend across the plurality of active regions 110 and the isolation film 120.

Referring to FIG. 11C, the plurality of word lines 130 are formed on the positive fixed charge containing layer 340. That is, the positive fixed charge containing layer 340 may be interposed between the plurality of word lines 130 and the plurality of active regions 110 or between the plurality of word lines 130 and the isolation film 120. As described above, the plurality of word lines 130 are positioned on a lower level relative to the upper surfaces 110T of the plurality of active regions 110 or the upper surface 120T of the isolation film 120 (refer to FIG. 1B). The gate capping layer 134 covers the plurality of word lines 130. Such a series of processes may be similar to the processes described with reference to FIGS. 8D and 8E.

Figure 12A:
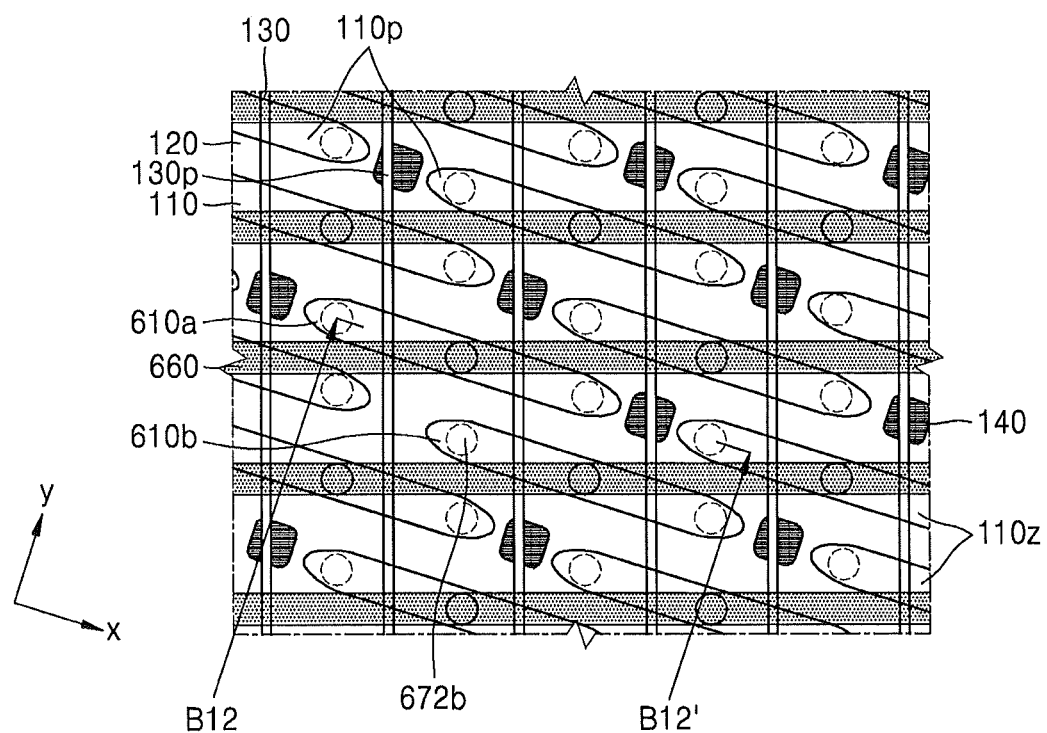
FIG. 12A is a plan view illustrating current characteristics of a semiconductor device according to embodiments of the inventive concept.
Figure 12B:
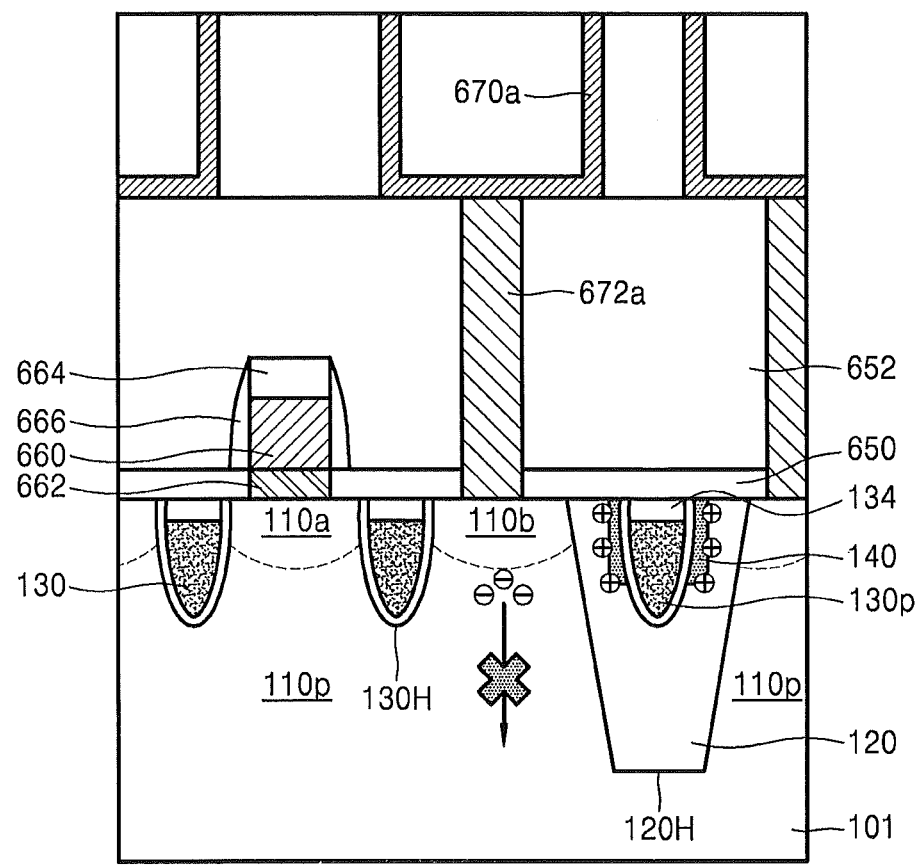
FIGS. 12B and 12C are cross-sectional views taken along line B12-B12' of FIG. 12A.
Figure 12C:
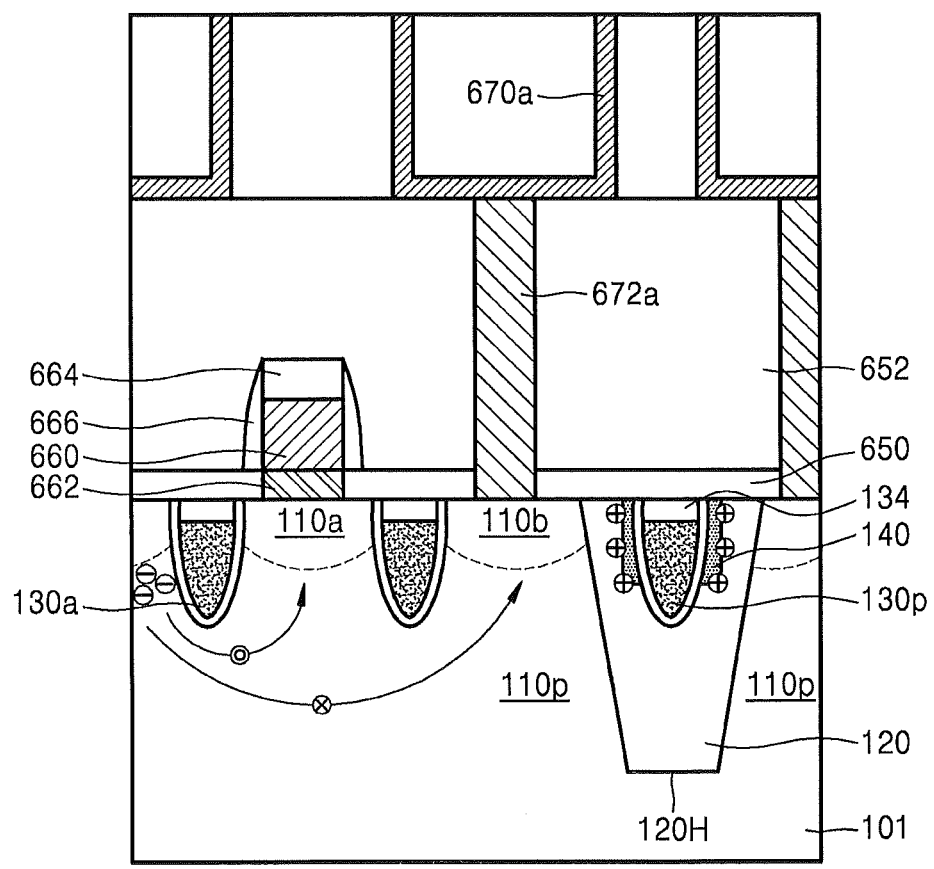

FIG. 12A is a plan view illustrating a current characteristic of a semiconductor device according to embodiments of the inventive concept. FIGS. 12B and 12C are cross-sectional views taken along line B12-B12' of FIG. 12A. In FIGS. 12A to 12C, the same reference numerals as those of FIGS. 1A to 11C refer to the same elements and detailed descriptions of the elements will not be repeated here.

Description is made based on an n-channel metal-oxide-semiconductor field-effect transistor (MOSFET) (NMOS) transistor with reference to FIGS. 12A to 12C. However, similar description may be made based on a p-channel (MOSFET) (PMOS) transistor.

Referring to FIGS. 12A and 12B, a first portion 130p positioned between a pair of active regions 110p adjacent in a first direction among a plurality of word lines 130 is surrounded by an isolation film 120 and a positive fixed charge containing layer 140.

In the case where the positive fixed charge containing layer 140 is not formed, when an operating voltage is applied to the first portion 130p positioned between the pair of active regions 110p adjacent in the first direction among the plurality of word lines 130, an escape wall of electrons filled in a second source/drain region 110b is not high. Therefore, in operation of the semiconductor device without the positive fixed charge containing layer 140, undesired movement of the electrons may occur.

In the semiconductor device according to the inventive concept, the first portion 130p positioned between the pair of active regions 110p adjacent in the first direction among the plurality of word lines 130 is surrounded by the isolation film 120 and the positive fixed charge containing layer 140. Therefore, positive charges formed in the positive fixed charge containing layer 140 maintain the escape wall of the electrons filled in the second source/drain region 110b high when the operating voltage is applied to the first portion 130p positioned between the pair of active regions 110p adjacent in the first direction among the plurality of word lines 130. That is, it is possible to prevent the electrons filled in the second source/drain region 110b from undesirably moving in the operation of the semiconductor device.

Referring to FIGS. 12A to 12C, when the operating voltage is applied to word lines 130a positioned in a plurality of active regions 110 among the plurality of word lines 130, current flows from a first source/drain region 110a to the second source/drain region 110b. That is, the electrons filled in the second source/drain region 110b move to the first source/drain region 110a. When positive charges exist in the isolation film 120 between a pair of active regions 110z adjacent in a second direction among the plurality of active regions 110, an energy wall, over which the electrons filled in the second source/drain region 110b are injected into another second source/drain region 110b adjacent to the second source/drain region 110b with the first source/drain region 110a interposed, is lowered so that a current characteristic of the semiconductor device may deteriorate. In the semiconductor device according to the inventive concept, since the positive charges do not exist in the isolation film 120 between the pair of active regions 110z adjacent in the second direction among the plurality of active regions 110, it is possible to prevent the energy wall, over which the electrons filled in the second source/drain region 110b are injected into another second source/drain region 110b adjacent to the second source/drain region 110b with the first source/drain region 110a interposed, from being lowered. That is, the current characteristic of the semiconductor device may be improved.

Figure 13:
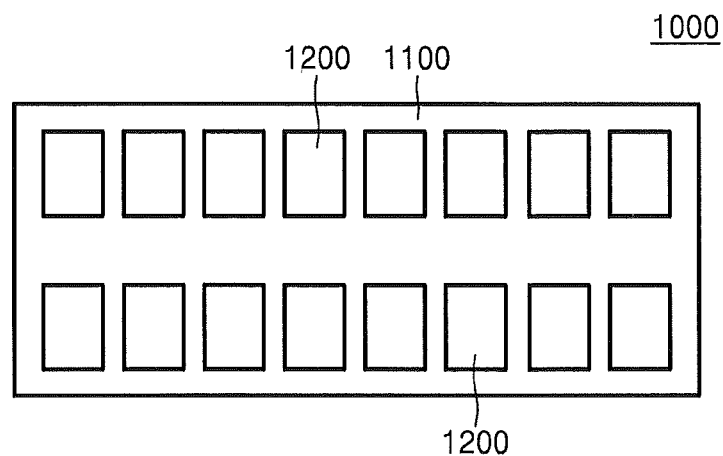
FIG. 13 is a plan view of a memory module including a semiconductor device according to the inventive concept.

FIG. 13 is a plan view of a memory module 1000 including a semiconductor device according to the inventive concept.

The memory module 1000 may include a printed circuit board (PCB) 1100 and a plurality of semiconductor packages 1200.

The plurality of semiconductor packages 1200 may include any of the semiconductor devices 100, 200, 300, 400, 500, 600, and 700 according to the embodiments of the inventive concept. In particular, the plurality of semiconductor packages 1200 may include a distinctive structure of at least one semiconductor device selected from the above-described semiconductor devices according to the embodiments of the inventive concept.

The memory module 1000 according to the inventive concept may be a single in-lined memory module (SIMM), in which the plurality of semiconductor packages 1200 are mounted only on one surface of the PCB 1100 or a dual in-lined memory module (DIMM), in which the plurality of semiconductor packages 1200 are arranged on both surfaces of the PCB 1100. In addition, the memory module 1000 according to the inventive concept may be a fully buffered DIMM (FBDIMM) having an advanced memory buffer (AMB) for providing external signals to the plurality of semiconductor packages 1200, respectively.

Figure 14:
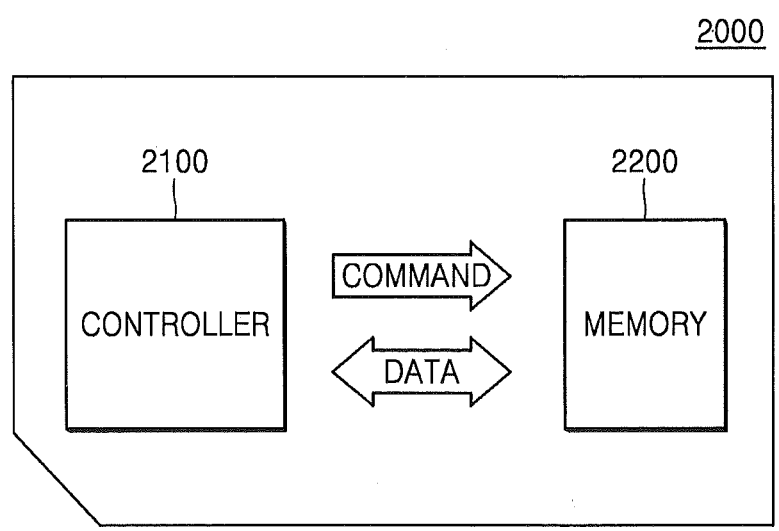
FIG. 14 is a block diagram of a memory card including a semiconductor device according to the inventive concept.

FIG. 14 is a block diagram of a memory card 2000 including a semiconductor device according to the inventive concept.

The memory card 2000 may be arranged so that a controller 2100 and a memory 2200 exchange electrical signals. For example, when the controller 2100 issues a command, the memory 2200 may transmit data.

The memory 2200 may include any of the semiconductor devices 100, 200, 300, 400, 500, 600, and 700 according to the embodiments of the inventive concept. In particular, the memory 2200 may include a distinctive structure of at least one semiconductor device selected from the above-described semiconductor devices according to the embodiments of the inventive concept.

The memory card 2000 may form various kinds of memory cards such as a memory stick card, a smart media card (SM), a secure digital card (SD), a mini-secure digital card (mini-SD), and a multimedia card (MMC).

Figure 15:
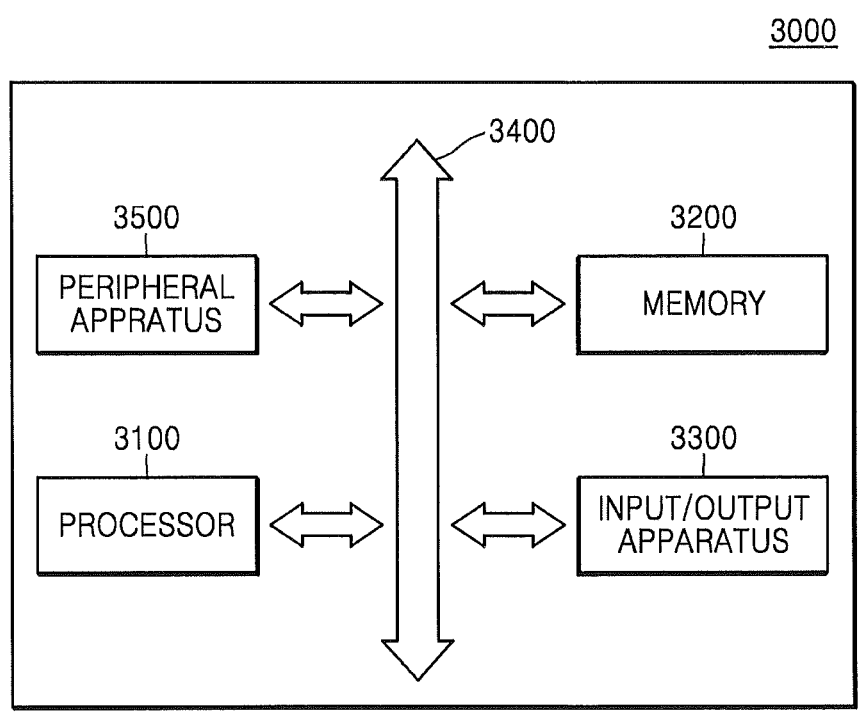
FIG. 15 is a schematic diagram of a system including a semiconductor device according to the inventive concept.

FIG. 15 is a schematic diagram of a system 3000 including a semiconductor device according to the inventive concept.

In the system 3000, a processor 3100, a memory 3200, and an input/output apparatus 3300 may perform data communications via a bus 3400.

The memory 3200 of the system 3000 may include random access memory (RAM) and read only memory (ROM). In addition, the system 3000 may include a peripheral apparatus 3500 such as a floppy disk drive and a compact disk (CD) ROM drive.

The memory 3200 may include any of the semiconductor devices 100, 200, 300, 400, 500, 600, and 700 according to the embodiments of the inventive concept. In particular, the memory 3200 may include a distinctive structure of at least one semiconductor device selected from the above-described semiconductor devices according to the embodiments of the inventive concept.

The memory 3200 may store code and data for operation of the processor 3100.

The system 3000 may be used for a mobile phone, an MP3 player, a navigation system, a portable multimedia player (PMP), a solid state disk (SSD), or household appliances.

While the inventive concept has been particularly shown and described with reference to exemplary embodiments thereof, it will be understood that various changes in form and details may be made therein without departing from the spirit and scope of the following claims.

What is claimed:

1. A semiconductor device comprising:
   a substrate including a plurality of active regions having a long axis in a first direction and a short axis in a second direction, the plurality of active regions being repeatedly and separately positioned along the first and second directions;
   an isolation film defining the plurality of active regions;
   a plurality of word lines extending across respective ones of the plurality of active regions and the isolation film and comprising a first word line; and
   a positive fixed charge containing layer covering at least a portion of a sidewall of the first word line, wherein a lowermost surface of the first word line extends beyond a lowermost surface of the positive fixed charge containing layer away from an upper surface of the isolation film.

2. The semiconductor device of claim 1, wherein upper surfaces of the word lines are lower than upper surfaces of the plurality of active regions.

3. The semiconductor device of claim 1, wherein the positive fixed charge containing layer comprises a material different from the isolation film.

4. The semiconductor device of claim 1,
   wherein the first word line comprises a first portion positioned between two active regions adjacent in the first direction and a second portion positioned between two active regions adjacent in the second direction,
   wherein the first portion of the first word line is in the isolation film and the positive fixed charge containing layer covers at least a portion of the sidewall of the first portion, and
   wherein the second portion of the first word line is in the isolation film and the positive fixed charge containing layer does not cover the sidewall of the second portion.

5. The semiconductor device of claim 1, wherein the positive fixed charge containing layer comprises silicon nitride or silicon oxynitride.

6. The semiconductor device of claim 1 further comprising a plurality of gate dielectric layers contacting respective sidewalls of the plurality of word lines, wherein the plurality of gate dielectric layers comprise a material different from the positive fixed charge containing layer.

7. The semiconductor device of claim 6, wherein one of the plurality of gate dielectric layers is between the first word line and the positive fixed charge containing layer and contacts the positive fixed charge containing layer.

8. The semiconductor device of claim 1, wherein the first word line comprises a first portion in the isolation film and a second portion in one of the plurality of active regions, and
   wherein the positive fixed charge containing layer at least partially covers the sidewall of the first portion of the first word line and does not cover the sidewall of the second portion of the first word line.

9. The semiconductor device of claim 1, wherein the plurality of active regions comprises a first active region and a second active region that are spaced apart along the first direction and are directly adjacent each other,
   wherein the first word line extending between the first and second active regions and comprising a first portion that is between the first and second active regions and is aligned with the first active region along the first direction and a second portion not between the first and second active regions, and
   wherein the positive fixed charge containing layer at least partially covers the sidewall of the first portion of the first word line and does not cover the sidewal l of the second portion of the first word line.

10. A semiconductor device comprising:
    an isolation film on a substrate:
    a plurality of active regions on the substrate and defined by the isolation film, wherein each of the plurality of active regions has a long axis in a first direction and a short axis in a second direction;
    a plurality of word lines extending across respective ones of the plurality of active regions and the isolation film; and
    a plurality of positive fixed charge containing layers at least partially covering respective sidewalls of the plurality of word lines,
    wherein, among the plurality of active regions, a pair of active regions adjacent in the second direction are shifted in opposite directions in the first direction to partially overlap in the second direction so that the pair of active regions are aligned athwart, and
    wherein the plurality of positive fixed charge containing layers are absent from a space between the pair of active regions.

11. The semiconductor device of claim 10, further comprising a plurality of gate dielectric layers contacting respective sidewalls of the plurality of word lines, wherein the plurality of gate dielectric layers comprise a material different from the plurality of the positive fixed charge containing layers.

12. The semiconductor device of claim 11, wherein each of the plurality of the positive fixed charge containing layers coniprises silicon nitride or silicon oxynitride.

13. The semiconductor device of claim 10, wherein lowermost surfaces of the plurality of word lines extend beyond lowermost surfaces of the plurality of the positive fixed charge containing layers away from an upper surface of the isolation film.

14. The semiconductor device of claim 10, further comprising:
   a first interlayer insulating film on the plurality of active regions and the isolation film;
   a bit line on the first interlayer insulating film;
   a bit line contact connecting the bit line and a first active region selected from the plurality of active regions;
   a second interlayer insulating film on the bit line on the first interlayer insulating film;
   a first storage electrode on the second interlayer insulating film; and
   a first storage contact connecting the first storage electrode and the first active region.

15. The semiconductor device of claim 14, wherein a distance from one of the plurality of positive fixed charge containing layers to the first storage contact in the first direction is smaller than a distance from the one of the plurality of positive fixed charge containing layers to the bit line contact in the first direction.

16. A semiconductor device comprising:
   a substrate including a plurality of active regions having a long axis in a first direction and a short axis in a second direction, the plurality of active regions being positioned repeatedly and separately along the first and second directions and comprising a first active region and a second active region that are spaced apart along the first direction and are directly adjacent each other in the first direction;
   an isolation film defining the plurality of active regions;
   a plurality of word lines extending across respective ones of the plurality of active regions and the isolation film and comprising a first word line extending between the first and second active regions and being spaced apart from the first and second active regions, wherein the first word line comprises a first portion that is between the first and second active regions and a second portion not between the first and second active regions; and
   a positive fixed charge containing layer covering at least a portion of a sidewall of the first portion of the first word line and exposing a sidewall of the second portion of the first word line.

17. The semiconductor device of claim 16, wherein the plurality of active regions comprises a third active region that is spaced apart from the first active region in the second direction, and the first word line comprises a third portion in the third active region, and
   wherein the positive fixed charge containing layer exposes a sidewall of the third portion of the first word line.

18. The semiconductor device of claim 16 further comprising a plurality of gate dielectric layers contacting respective sidewalls of the plurality of word lines, wherein the plurality of gate dielectric layers comprise a material different from the positive fixed charge containing layer.

19. The semiconductor device of claim 18, wherein the positive fixed charge containing layer comprises silicon nitride or silicon oxynitride.

20. The semiconductor device of claim 16, wherein a lowermost surface of the first word line extends beyond a lowermost surface of the positive fixed charge containing layer away from an upper surface of the isolation film.

* * * * *